(12) United States Patent
Takahashi

(10) Patent No.: US 6,606,277 B2
(45) Date of Patent: Aug. 12, 2003

(54) SEMICONDUCTOR MEMORY DEVICE

(75) Inventor: Yasuhiko Takahashi, Higashimurayama (JP)

(73) Assignee: Hitachi, Ltd., Tokyo (JP)

( * ) Notice: Subject to any disclaimer, the term of this patent is extended or adjusted under 35 U.S.C. 154(b) by 67 days.

(21) Appl. No.: 09/925,417

(22) Filed: Aug. 10, 2001

(65) Prior Publication Data

US 2002/0018394 A1 Feb. 14, 2002

(30) Foreign Application Priority Data

Aug. 11, 2000 (JP) ........................................ 2000-245263

(51) Int. Cl.[7] ................................................. G11C 8/00
(52) U.S. Cl. ................................. 365/233; 365/189.04
(58) Field of Search ........................... 365/233, 189.04, 365/189.05, 230.03, 230.08

(56) References Cited

U.S. PATENT DOCUMENTS

| 6,061,759 | A | 5/2000 | Guo | 711/105 |
|---|---|---|---|---|
| 6,069,839 | A * | 5/2000 | Pancholy et al. | 365/233 |
| 6,314,049 | B1 * | 11/2001 | Roohparvar | 365/233 |
| 6,473,360 | B2 * | 10/2002 | Ooishi | 365/233 |

FOREIGN PATENT DOCUMENTS

| JP | 9-213070 | 8/1997 |
|---|---|---|
| JP | 11-45567 | 2/1999 |

* cited by examiner

Primary Examiner—Michael S. Lebentritt
Assistant Examiner—Anh Phung
(74) Attorney, Agent, or Firm—Miles & Stockbridge P.C.

(57) ABSTRACT

To provide a semiconductor memory device which has high speed operation and multifunctionality, and is suitable for 3D imaging. Data is output to a data terminal in synchronism with a synchronization signal during data read, write data is input via the data terminal in synchronism with a synchronization signal during data write, input of write data via the data terminal is permitted via the data terminal in a first period wherein output of read data to the data terminal should be performed, a second period is provided from when a write specification is issued to when input of write data starts, and a third period is provided during which input of write data is performed.

20 Claims, 15 Drawing Sheets

RASTER DIRECTION
(1 Pixel = 64 bit)

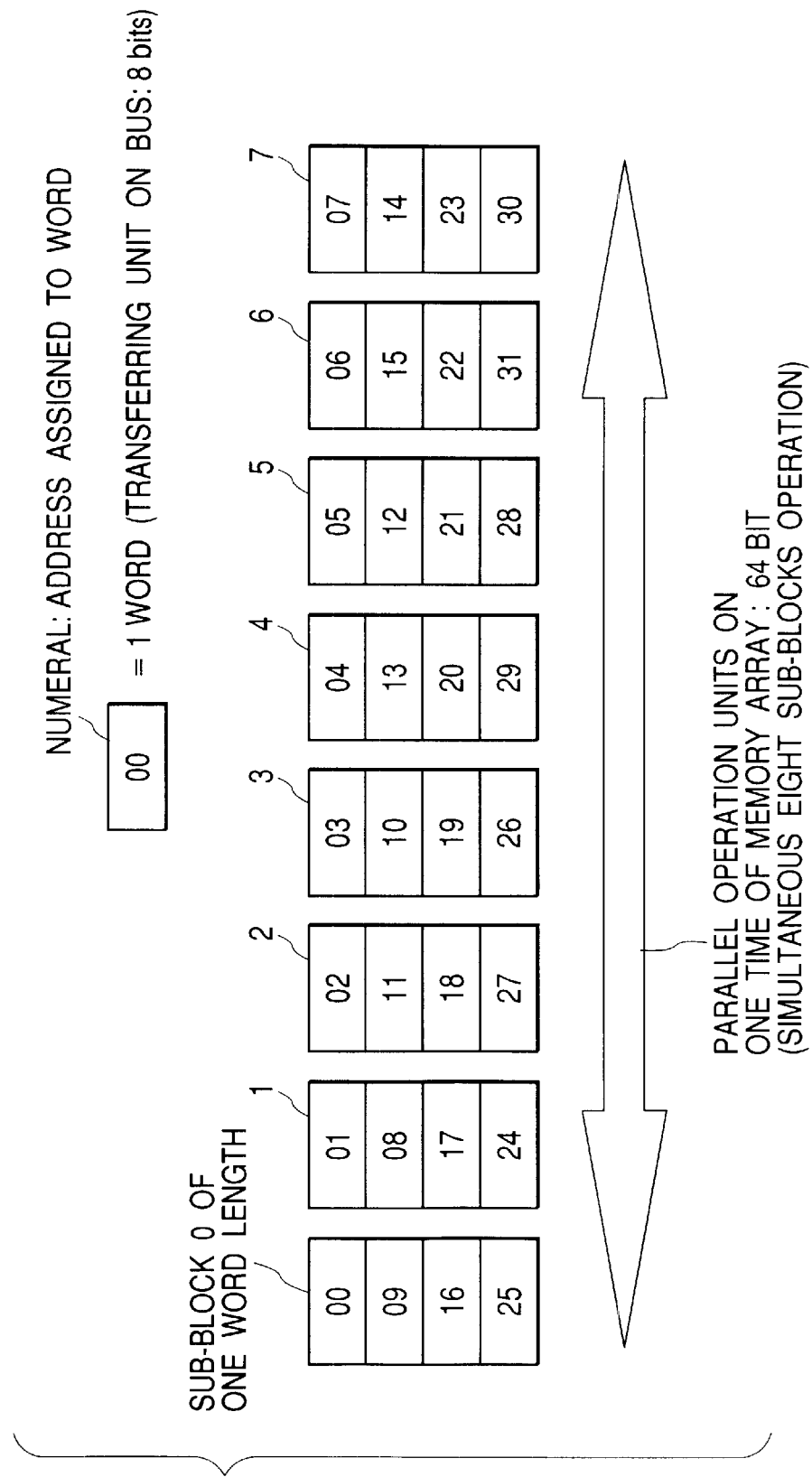

SEMICONDUCTOR MEMORY DEVICE

BACKGROUND OF THE INVENTION

This invention mainly relates to an effective technique for a high-speed prefetch type DRAM (dynamic random access memory) for 3D graphics.

Semiconductor memory devices are increasingly being required to perform high-speed operations due to improvements in speed accompanying technical progress of electronic systems. Synchronous semiconductor memory devices such as SDRAM (Synchronous DRAM) are capable of performing operations in a comparatively short cycle time irrespective of the period of a sequence of operations of internal circuits.

SUMMARY OF THE INVENTION

When performing read operations or write operations on a semiconductor memory device, these operations may be speeded up by an operating parallel arrangement due to a pipeline operation of the internal circuit which forms the semiconductor memory device. On the other hand, when the semiconductor memory device is required to perform read operations and write operations alternately without a break, the problem arises that the operating speed will be largely restricted.

That is, when it is desired to perform the above alternate operations, for read-out, read data must be transferred to the external after completing internal operations of the semiconductor memory device, and write data must be transferred from the external before internal write operations are performed. Hence, when it is attempted to continuously perform internal operations for read and write, the timings of data output to the external and data input from the external overlap. When the semiconductor memory device has a common data input/output terminal, i.e., when it complies with a bi-directional bus, this overlap of data output and data input timings is not permitted.

Therefore, when the above read operation and write operation are performed alternately, it is necessary to set a latency time for internal operations so that overlap of read data transfer timing and write data transfer timing is avoided. As a result, the aforesaid operating speed or throughput is largely restricted.

In the field of 3D graphics, a high-speed semiconductor memory device is desired. In this field, images are becoming finer with one image comprising a very large number of polygons comprising a very small number of pixels, e.g., about 1 to 5. In many cases, to generate such an image, the Z buffer method is used. In the Z buffer method, a Z value which is depth data is added to each pixel on the image buffer, and compared with the Z value already written when the pixel was written. Additions are made only to pixels further in front, so only planes visible from the viewpoint of overlapping objects are generated on the image buffer.

When using the Z buffer method, before writing the first pixel, it is necessary to initialize all the Z buffers at least by "the value which represents the furthest." Otherwise, it may occur that a pixel which should actually be written cannot be written due to the wrong Z value. Also, it is necessary to fill in pixel data with "the furthest color", i.e., a background color. As the whole screen is not necessarily covered by polygons, this is necessary to prevent pixel values which were not written when the image was generated from being indeterminate.

In a Z buffer algorithm 3D graphic system, when image data and Z data are stored in mutual addresses of the semiconductor memory device and only continuous data can be accessed, even during access such as screen refresh which does not need Z buffer data, useless Z buffer data is accessed and the effective transmission efficiency falls. This poses a problem in 3D graphic systems which require high-speed processing. The inventor thus developed a memory function for actual systems suited to this type of image generation.

From research of the literature, the Inventor found Japanese Laid-Open Published Patent Application No. 45567 of 1999 (referred to hereafter as prior art). In this prior art, in SDRAM (Synchronous DRAM), if there is a difference in the latency of a read operation and the latency of a write operation, and it is attempted to perform a write operation after a read operation, the write command cannot be input until the read data is output, and there will be a decline in the effective bandwidth of the data input/output terminal. In order to resolve the problem of bandwidth decrease, when the command immediately prior to the write command is a read command, the output signal of an intermediate data amplifier is stored in a temporary register, the read operation of a DRAM cell is suspended, the write data is input and written, the data evacuated to the temporary register after write termination is output to a data out latch, and the read operation is resumed by a clock signal. However, in this prior art, there is no mention of the bus control for actual systems oriented towards high-speed image processing according to this invention which is described hereafter.

In the above prior arts, read data which was not yet output is held by three storage means, i.e., a data amplifier, the temporary register and a data output latch, and the read data stored in the temporary register is output due to resumption of the read operation.

In this case, the input of a read command is needed for resumption of the read operation, and read data corresponding to this read command is also output after the resumed read data. Therefore, a read command must be input as a dummy command even when it is desired to output only the read data which has not yet been output, corresponding unnecessary read data will be output with a delay of plural clocks, and the bus will be occupied to output the unnecessary data.

Moreover, according to the data input/output operation of the prior art, write data will be input by the clock immediately after the read data was output. As a signal delay occurs in data transfer on the bus, in the memory circuit as shown in timing charts such as FIG. 2 and FIG. 3 of the prior art, write data is input by the clock following data output, so competition of read data and write data on the bus cannot be avoided. Hence, there is a very strong possibility that a signal error will arise due to competition between the read data and write data.

It is therefore an object of this invention to provide a semiconductor memory device which offers an improvement in speed and multi-functionality of operation.

It is another object of this invention to provide a suitable semiconductor memory device for 3D picture generation.

It is yet another object of this invention to provide a semiconductor memory device which aims at improved user-friendliness in addition to improvement in operating speed.

The above objects, other objects and new features of this invention will become clear from the description and accompany drawings of this specification.

The essential features of this invention as disclosed in this application may be simply described as follows. In a data read operation, read data is output to a data terminal in synchronism with a synchronization signal, and in a data write operation, write data is input via this data terminal in synchronism with a synchronization signal. The input of write data via the data terminal is permitted within a first time period when the output of this read data to the data terminal should be performed. Further, a second time period from when a write operation is specified to when input of write data is started, and a third time period when the input of the write data is performed, are provided, and the output of the read data to the data terminal is permitted within the second time period.

The other essential features of this invention as disclosed in this application may be simply described as follows. The semiconductor memory device comprises a bi-directional interface which performs read and write data transfer in synchronism with a clock signal, plural memory mats each forming a bank which can operate independently, and a mechanism which lowers a word line in a memory mat in which read or write is performed in a bank specified by the aforesaid read or write command after an operation according to a first read or write command, and automatically performs a sequence of operations which precharges a sense amplifier group.

When a second read or write command is issued to the same bank immediately after the above read or write command, a series of operations which begins from the start of a word line which is performed automatically, is extended until the end of the read or write command issued immediately afterwards.

The other essential features of the invention disclosed in the above application may be simply summarized as follows. The semiconductor memory device comprises a bi-directional interface which permits read and write data transfer in synchronism with a clock signal, plural memory blocks forming banks which can operate independently, a mechanism which raises a word line having an address specified by a row address in a bank specified by a bank address part in a command and reads on a sense amplifier group corresponding to the contents of plural memory cells, a mechanism which writes part or all of the bits specified by a column address part in a command from an internal data latch, and a mechanism which lowers a word line in a memory mat in which read or write is performed in a bank specified by a read or write command after the read or write command is terminated, and precharges the sense amplifier group.

The data is set to the internal data latch, a first command is performed which writes from the internal data latch to plural sense amplifier groups, a second command is performed which lowers the word line which is presently raised without precharging the sense amplifiers and then raises the specified word line, and when the second command does not follow immediately after the first or second command, ordinary operation is performed wherein the word line is lowered and the sense amplifier is precharged.

Another typical example of this invention disclosed in the present application may be simply described as follows. The semiconductor memory device in which data read operations and data write operations are specified by commands, responds to a first read command which performs data read from a memory address according to address information, and a second command which has a different command code from the first command, and which performs data read from sequential alternate memory addresses from a read start address.

Another typical example of this invention disclosed in the present application may be simply described as follows. The semiconductor memory device comprises plural memory banks, and a synchronized bi-directional interface which is common to the plural memory banks, and which performs output of read data and input of write data in synchronism with a clock signal. It permits read operation and write operation commands according to the memory bank specification. When one read operation is specified, read data is output via the synchronized bi-directional interface from the specified Fax memory bank after a first time period has elapsed, this first time period being an integral multiple of a unit time period specified by the aforesaid clock signal, from a timing at which the operation is specified. When one write operation is specified, write data is acquired by the specified memory bank via the aforesaid synchronized bi-directional interface after a second time period has elapsed, this second time period being an integral multiple of the unit time period specified by the aforesaid clock signal from a timing specified by the write operation.

The semiconductor memory device can respond to plural sequential read operation commands or plural sequential write operation commands for each unit time period specified by the aforesaid clock signal regardless of the first or second time period corresponding to the preceding operation command. When a write operation is commanded before termination of the preceding read operation, output of read data via the synchronized bi-directional interface is permitted until a second time period corresponding to a write operation command, and write data is then acquired via the synchronized bi-directional interface after the aforesaid second time period has elapsed.

Another typical example of this invention disclosed in the present application may be simply described as follows. The semiconductor memory device whereof the internal operation is specified by external operation commands, responds to a first command having a first command code, which clears the contents of plural memory cells forming a memory block in synchronism with a first unit time period determined by the synchronization signal, and a second command having a second command code different from the first command code which writes data from a data transfer region to memory cells addressed by a memory block with the second unit time period determined by the aforesaid synchronization signal as time period.

BRIEF DESCRIPTION OF THE DRAWINGS

FIG. 10 is an address mapping diagram assigned to data in a sub-block of one embodiment of the semiconductor memory device according to this invention.

PREFERRED EMBODIMENTS OF THE INVENTION

Figure 1:
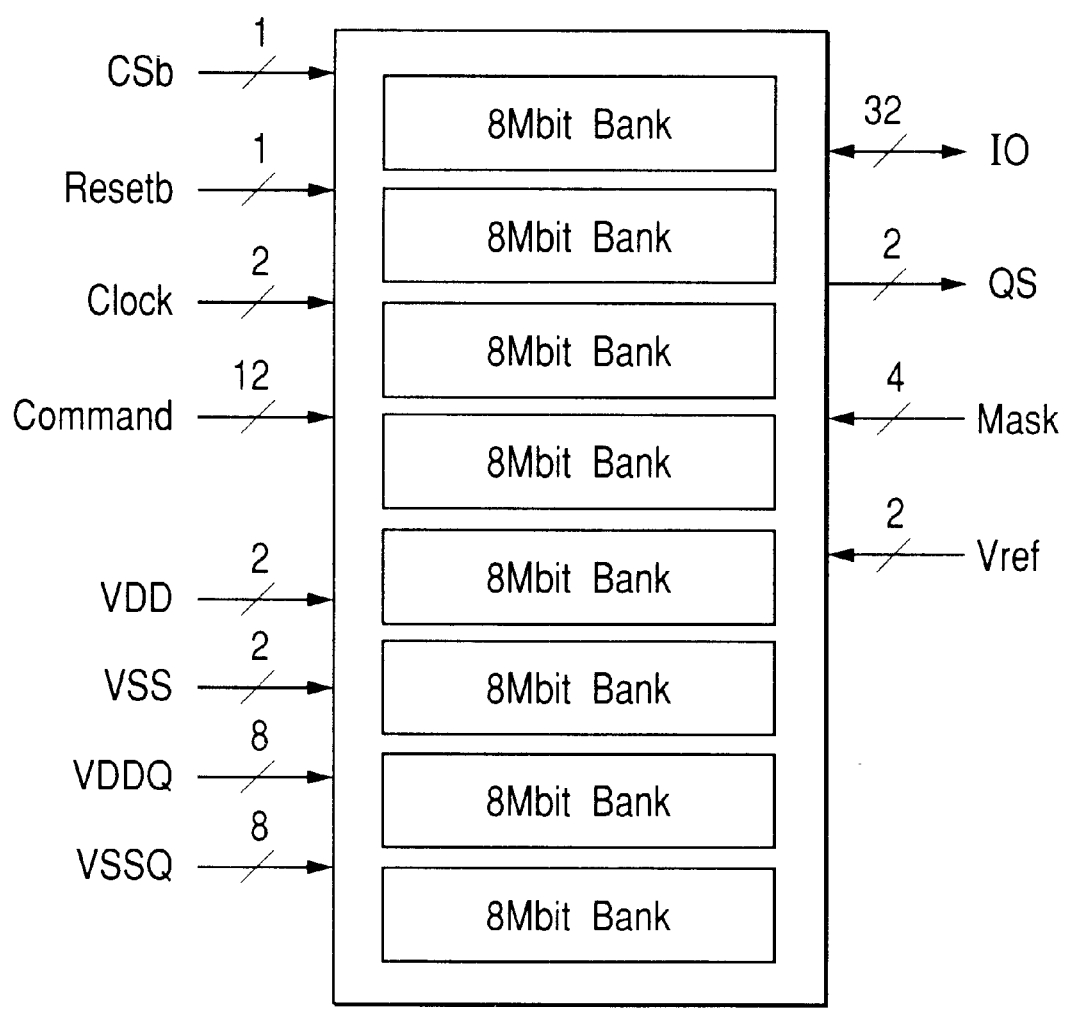
FIG. 1 is a schematic view showing one embodiment of the semiconductor memory device according to this invention.

FIG. 1 shows a schematic view of one embodiment of the semiconductor memory device according to this invention. In this embodiment, there are eight memory banks which can operate independently. There is no particular limitation on these memory banks, but they each comprise memory blocks having a storage capacity of approximately 8 M bits.

The semiconductor memory device according to this embodiment has 76 external terminals as shown as examply in the same figure. A terminal Csb is a chip select terminal, and when a chip select signal supplied to the terminal is lower level, it is in a chip selection state. A terminal Resetb is a reset terminal, and when it is at a lower level, the device enters the reset state, and the output terminal is high impedance. A terminal Clock is a clock terminal, two of which are provided for inputting a complementary clock signal.

There are terminals "Command" of twelve comprising combinations of command and address signals, having a hierarchy and packet structure described hereafter. They may have a storage capacity of approximately 64 Mb as in this embodiment, a storage capacity of 48 Mb or a storage capacity of 32 Mb. Alternatively, a test mode can also be applied in addition to the ordinary operating mode.

Terminals VDD, VSS are power supply terminals for an internal circuit, two of each being respectively provided. Terminals VDDQ, VSSQ are power supply terminals for an output circuit, and as the power supply terminals of the output circuit are independent, noise produced in the power supply terminals VDDQ, VSSQ during output circuit operation can be prevented from being directly transmitted to other internal circuits. There are eight of each of the terminals VDDQ, VSSQ, 32 output circuit corresponding to input/output terminals IO are divided by eight into four groups, and the two pairs of VDDQ, VSSQ are respectively assigned to them.

The terminal IO is an input/output terminal which is used for input or output of data in 32 bit units. A terminal QS is a clock signal synchronized with the data input/output from the terminal IO, two of them being provided for input/output of the auxiliary clock signal. A terminal Mask is a terminal for indicating a write mask in byte (8 bit) units. 32 bit input data input from the IO terminal is divided into four groups of 8 bits each, the four mask terminals corresponding to these groups to implement a write mask in byte units. A terminal Verf is for inputting a reference voltage of the input signal corresponding to the aforesaid terminals, two of them being provided.

Figure 2:
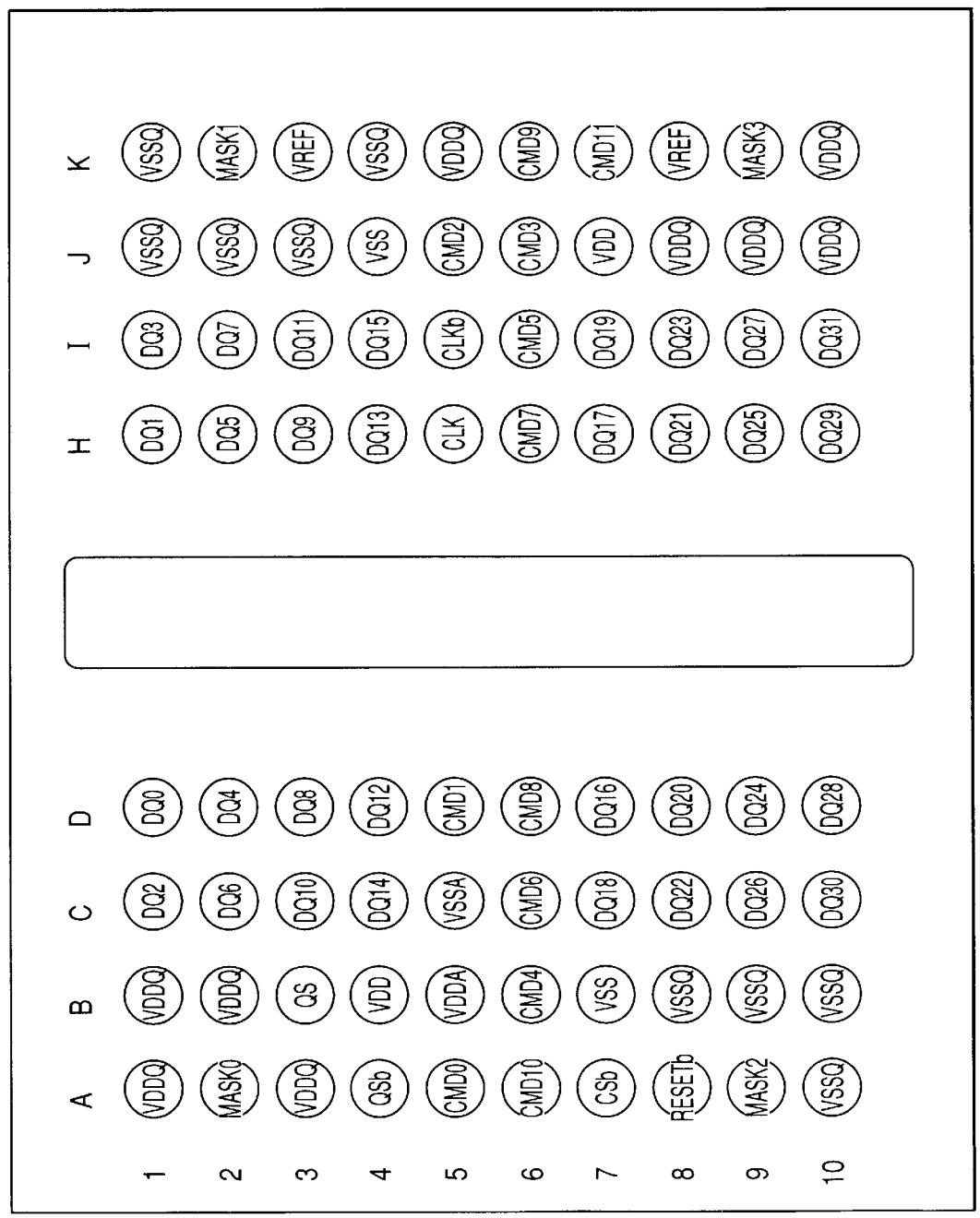
FIG. 2 is a pin layout diagram showing one embodiment of the semiconductor memory device according to this invention.

FIG. 2 shows the pin layout of one embodiment of the semiconductor memory device according to this invention. The semiconductor memory device according to this invention is provided with 76 terminals as described above, and although there is no particular limitation, they may be mounted on an 80 pin CSP package. 10×8 columns=80 pins are divided into two groups of 40 pins each, i.e., an ABSD column and an HIJK column, on the underside of the package. Although there is no particular limitation, the input/output terminal IO may be assigned to these groups by dividing into even numbers and odd numbers such as DQ1–DQ31 and DQ0–DQ30. The memory chip has a peripheral circuit such as an input/output part at a position corresponding to the center of the underside of the package, eight memory banks being provided in two groups of four each around the peripheral circuit.

Figure 3:
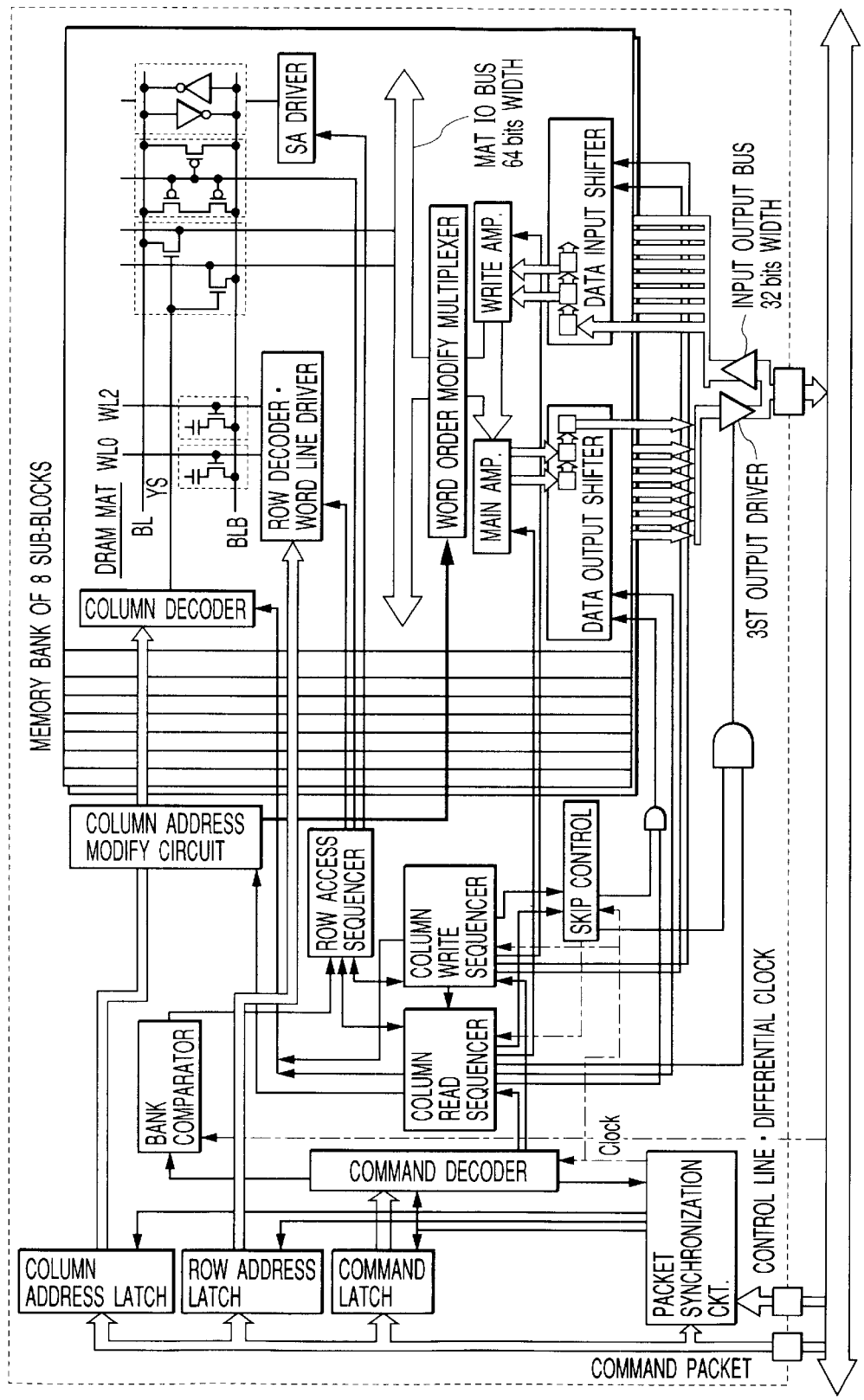
FIG. 3 is an overall block diagram showing one embodiment of the semiconductor memory device according to this invention.

FIG. 3 is a general block diagram of one embodiment of the semiconductor memory device according to this invention. The semiconductor memory device according to this invention has no particular limitation, and data input/output operations are performed in synchronism with both of edges of the clock as in a DDR-SDRAM (Double Data Rate Synchronous Dynamic Random Access Memory). In this embodiment, eight memory blocks are provided corresponding to eight memory banks as described above. Although there is no particular limitation, one memory block may comprise eight sub-blocks, one of these sub-blocks being shown schematically as an example in the same figure.

The sub-block comprises a DRAM mat, and although there is no particular limitation, dynamic memory cells each comprising an address selection MOSFET and storage capacitor are provided at the intersection of pairs of bit lines BL, BLB and word lines WL0, WL2 which extend parallel. One of the word lines WL0, WL1 is selected by a row decoder and word driver. A precharge circuit which performs precharge and equalization due to a precharge signal supplied from a row access sequencer, a sense amplifier comprising a CMOS latch circuit, and a column switch MOSFET switch controlled by a selection signal YS formed by the row decoder are provided to the bit lines BL, BLN. The sense amplifier of the DRAM mat is an amplification circuit which detects and amplifies a minute potential difference appearing on auxiliary data lines due to data readout from the memory cells.

A mat IO bus having 64 bits width which is twice that of the 32 bit width input/output bus is provided from the DRAM mat of the sub-block. Specifically, 64 pairs of bit lines are selected by the column switch MOSFET, by a selection signal YS formed by the column decoder, and are connected to the mat IO bus. The mat IO bus is respectively connected to 64 main amplifyers and 64 write amplifiers corresponding to the 64 bits via a word order modify multiplexer.

This is in order to adapt to higher speeds of the data bus, and to the fact that bus interfaces having transfer periods faster than the internal operations of the semiconductor memory device by many times, are now coming into use. To comply with these high-speed bus interfaces, data which is internally an integral multiple of the bit length of the input/output bus is read or written, and a serial/parallel conversion circuit is provided between the bus interface and memory block to change the speed. This data which is an integral multiple of the bit length of the bus internally is referred to as "prefetch" when it is read first, and as "preload" when it is stored in an internal register and written in one internal operation. According to this embodiment, by using prefetch for twice the amount of data as described above, the bus interface should have twice the speed of an internal operation.

To enable "prefetch" and "preload", in the memory banks, the main amplifier outputs data 32 bits at a time to a data output shifter. Conversely, data input serially 32 bits at a time is converted to 64 bit data by the data input shifter. To perform serial/parallel conversion in the data output shifter, a control signal is transferred from a column READ sequencer and skip control circuit. To perform serial/parallel conversion in the data input shifter, a control signal is transferred from a column WRITE sequencer.

The data output shifter and data input shifter are respectively provided to the eight memory banks. In the data output shifter, 32 bit data corresponding to the memory banks selected by the column READ sequence and skip control circuit is output from the input/output terminal via a 3ST (high-level, low level and high impedance) output driver which operates by receiving a logic signal of a control signal from the column READ sequencer and skip control circuit. 32 bit input data input from the input/output terminal is also transferred to data corresponding to the memory banks selected by the control signal from the column WRITE sequencer.

In the semiconductor memory device of this embodiment, operations are specified by commands, but they are very different from the SDRAM commands or address input system of the prior art. Specifically, a command and address information are input as one command packet. For this purpose, in the internal circuit, the command packet is divided into a command, row address and column address by a synchronization circuit, and these are acquired respectively by a command latch, row address latch and column address latch. By using this command packet, it is easy to alternately interchange a memory having a storage capacity of approximately 64 M bits as in this embodiment and a memory having a large storage capacity such as 128 M bits or 286 M bits. It is of course also easy to replace by a semiconductor memory device of smaller storage capacity than the aforesaid 64 M bits.

The command acquired by the command latch is decoded by the command decoder, and a control signal is output to realize operations corresponding to commands in the column READ sequencer which controls read operations, column WRITE sequencer which controls write operations and a bank comparison circuit.

The row access sequencer receives a signal from the bank comparator and signals from the column READ sequencer and column WRITE sequencer, and validates the column decoder/word and driver of the memory banks selected from the memory banks. In this way, the column decoder/word driver whereof the operation is validated decodes the address signal acquired by the row address latch, and selects a word line in one sub-block in the memory bank. The row access sequencer generates a timing signal which activates a sense amplifier which amplifies a minute signal from a memory cell read from the auxiliary bit lines BL, BLB corresponding to the selected operation of the word line in the sub-block, and drives the SA driver. In this way, an address selection operation in the memory block row system is performed.

The address signal acquired by the column address latch is transmitted to the column decoder of the memory bank via a column address modify circuit. This column address modify circuit is provided in order to perform special operations for 3D image signal processing described hereafter, and is made to control the word order modify multiplexer.

The column access sequencer is divided into a column READ sequencer and a column WRITE sequencer corresponding to a read operation and write operation. Specifically, in a read operation, the parallel/serial conversion operation due to "prefetch" is controlled, and in a write operation, the serial/parallel conversion operation due to "preload" is controlled. Sequence control is performed in accordance with these operations.

An essential feature of this embodiment is that the column WRITE sequencer may control the column READ sequencer. In the semiconductor memory device of this embodiment, read operations and write operations are not performed independently corresponding to respective commands, but control of the read system is performed by a write system signal to implement a write operation during read. In other words, during read by prefetch, when a write operation is specified, the read operation is suspended and the write operation is preferentially validated. When the write operation terminates, read data which has not yet been output is automatically output.

Regarding data input/output operations, the main operations performed by the semiconductor memory device are internal read and write. In the case of continuous read or write, these two operations can be performed in parallel by a pipeline, and the logical throughput of the semiconductor memory device is governed by the longer of the time required to perform internal operations and the time required for data output. However, when read and write are alternately performed seamlessly, the preceding read is transferred after completion of an internal operation and the next write is transferred prior to an internal operation, so when internal operations continuously performed, the timing of data output and the timing of data input overlap.

The bi-directional bus cannot perform data output and data input simultaneously, so when a write operation is performed after a read operation, it is necessary to delay the start of the write operation to prevent overlap of timings. Hence, in an ordinary semiconductor memory device of the prior art, when read and write are performed alternately compared to the case where read or write are performed continuously, the effective throughput falls due to the wait time for preventing overlap of transfer timings.

One solution to this problem might be a mechanism which temporarily stores write data in a write buffer, and performs the actual write operation during the idle time of the internal timing. To obtain maximum efficiency, control must be performed so that writing to the write buffer and the actual write are always performed simultaneously, but the next write data may not always be ready at the right timing, so a delay time will again occur. Further, after data is written to the write buffer, if a read operation is performed to an address which was written before the actual write was performed, the wrong data will be read, so data consistency must be controlled. Hence, in this embodiment, a function is provided so that the write operation is performed during the aforesaid read, and the read is then resumed later.

Figure 4:
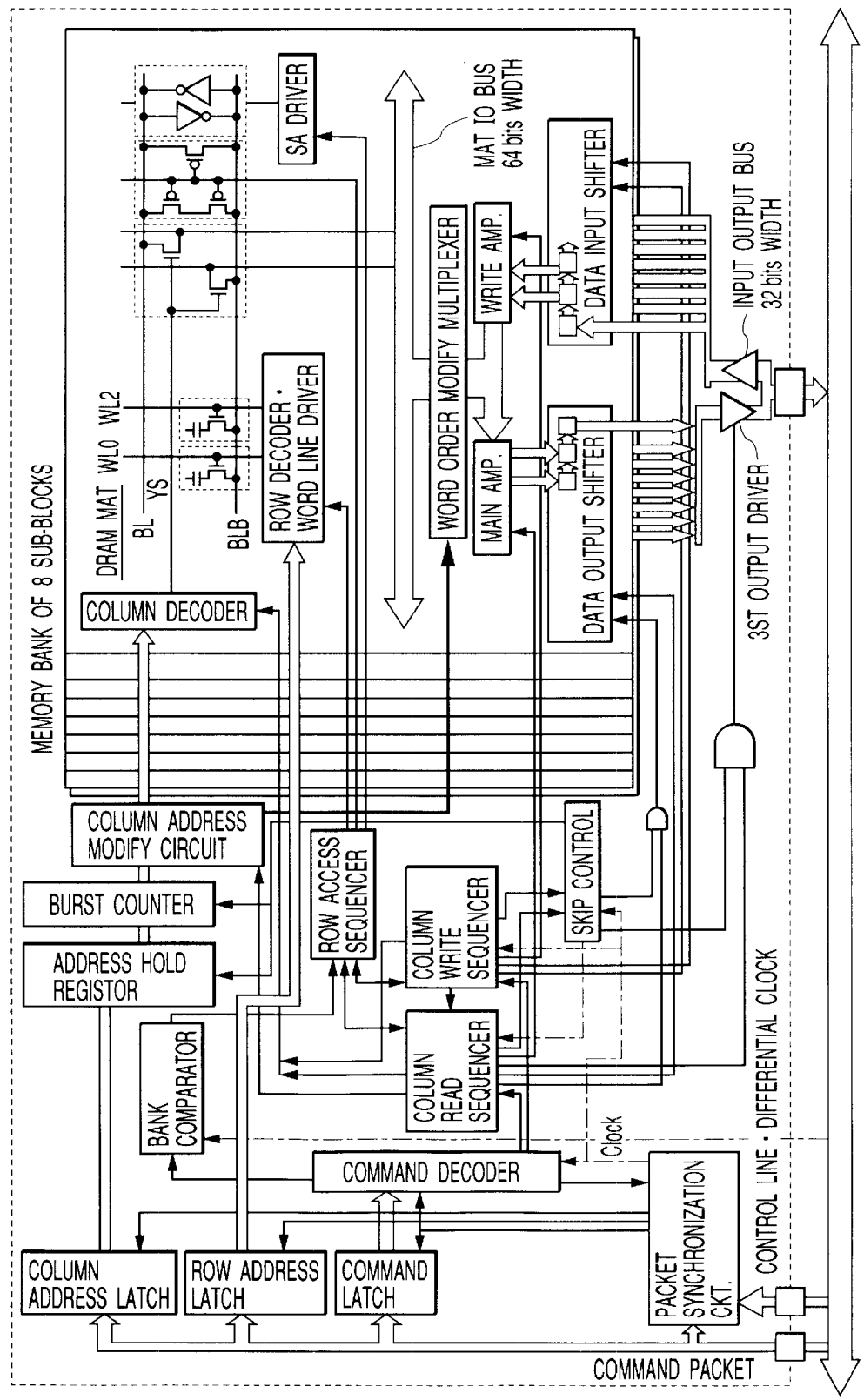
FIG. 4 is an overall block diagram showing another embodiment of the semiconductor memory device according to this invention.

FIG. 4 is an overall block diagram of another embodiment of the semiconductor memory device according to this invention. In this embodiment, the basic construction is identical to that of the embodiment of FIG. 3, but a burst counter and address hold register to realize burst operations are provided as a column selection circuit. Specifically, in the semiconductor memory device of this embodiment, burst read or burst write operations are available as selectable operations of the column system.

This burst operation makes use of, for example, the SDRAM of the prior art. The head address of the column address is set in the burst counter, column addresses are generated by the burst counter, the column selection operation is sequentially changed over, and a memory cell connected to a maximum of one word line is continuously accessed. If this burst operation is added, when a write command is input during a burst read, a column address corresponding to a write command is input to the burst counter, so the address which is being read is lost.

Thus, before the column address which is input corresponding to the write command is incorporated in the burst counter, the counter value in the burst counter during read is held in the address hold register. When the write operation terminates and the read operation is resumed, the counter value held in the address hold register returns to the burst counter. Apart from this burst operation function, the circuit blocks of the embodiment in FIG. 4 are identical to those of the embodiment in FIG. 3, so their description will not be repeated here.

Figure 5:
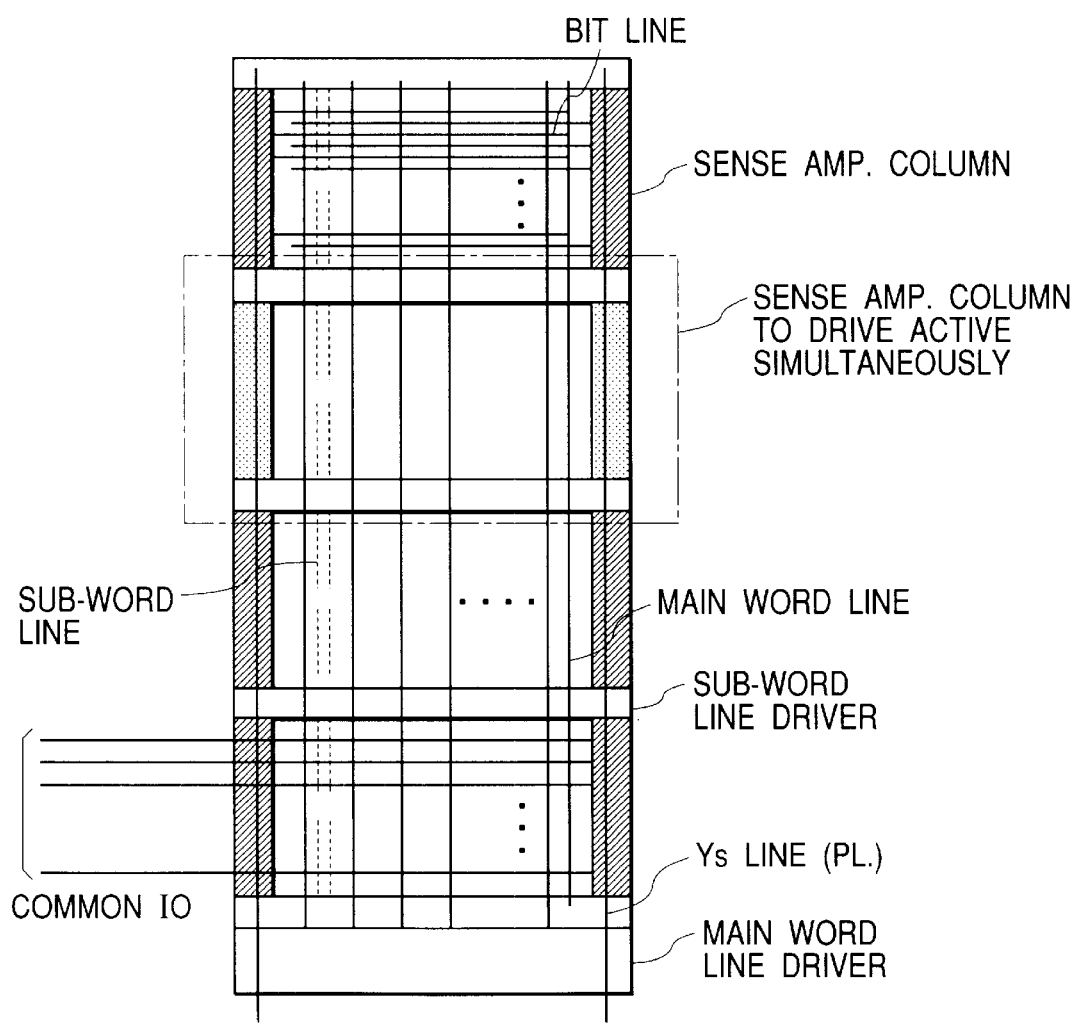
FIG. 5 is a schematic view showing one embodiment of a sub-block of FIG. 3, FIG. 4.

FIG. 5 shows a schematic construction of an embodiment of a sub-block of FIG. 3, FIG. 4. Although there is no particular limitation, the sub-block is divided into four memory mats. Specifically, the sub-block is divided into four memory mats in the vertical direction (word line direction). A sub-word driver is disposed in the upper and lower parts of the memory mat, and a sense amplifier is disposed to the left and right of the memory mat.

A main word driver is provided in the lower part of the sub-block comprising four memory mats. The main word driver forms a selection signal of a main word line extending in the vertical direction so as to pass through the four memory mats. A sub-word line selection driver is provided in the main word driver which forms a sub-word line selection signal which selects one sub-word line in plural sub-word lines assigned to one main word line. Also, although there is no particular limitation, a mat selection circuit is also provided which forms a mat signal which selects one memory mat in the four memory mats. This mat selection circuit selects only sub-word lines in one memory mat of the four memory mats, and correspondingly, regarding the sense amplifiers, only the sense amplifier column corresponding to the selected memory mat is activated in one operation.

In one memory mat, 256 pairs of bit lines extend in the horizontal direction of the figure. The 256 pairs of bit lines are joined at the input/output nodes of each of 128 sense amplifiers split amplifiers split into 128 pairs disposed to the left and right. Although there is no particular limitation, by disposing sense amplifiers connected to adjacent bit lines to the left and right, sense amplifiers requiring a relatively large occupancy surface area can be formed with the bit line pitch of two pairs, so sense amplifiers and bit lines can be disposed with a high degree of integration.

Although there is no particular limitation, 1024 sub-word lines are provided in one memory mat. The sub-word lines are disposed so that the sub-word drivers which drive adjacent sub-word lines whereof two form one pair, are disposed at the top and bottom. Hence, by disposing the sub-word drivers in the upper and lower parts of the memory mat in this way, two sub-word drivers which require a relatively large occupancy surface area are formed in accordance with the pitch of four sub-word lines, so sub-word drivers and sub-word lines can be disposed with a high degree of integration.

Alternatively, the sub-word lines may be separated in the central part as shown by the dotted line in the figure, and the divided lines may respectively be driven by sub-word drivers provided in the top and bottom of the memory mat. In this case, the number of memory cells connected to one sub-word line can be reduced to 128 corresponding to the division of the sense amplifiers, so a rapid sub-word line selection operation can be performed.

Although there is no particular limitation, local input/output lines are provided in groups of 32 pairs in the sense amplifier columns provided to the left and right of the sub-blocks. For example, in a sense amplifier column on the right of the memory mat, when word line selection is performed in memory mat units as described above, 128 pairs of auxiliary bit lines are divided into four groups of 32 pairs each, selected by four YS lines, and connected to the local input/output lines. Likewise, 32 pairs of local input/output lines and the YS selection line corresponding to them are also provided in the sense amplifier column on the left-hand side.

A common IO line is provided for the eight sub-blocks. This common IO line comprises 64 pairs of signal lines (mat IO bus) corresponding to the "prefetch" and "preload". The local input/output lines of the sub-blocks and the common IO (mat IO bus) are alternately connected by selection with a sub-block selection signal.

The memory mat is provided with 256 pairs of bit lines and 1024 pairs of sub-word lines as described above, so it has a storage capacity of approximately 256 K bits. One sub-block comprises four memory mats, and has a storage capacity of 256 K×4=1 M bits. One memory bank comprises 8 sub-blocks as described above, and therefore has a storage capacity of approximately 8 M bits.

In one memory bank, instead of selecting one sub-block and performing input/output of 64 bits of data, the sub-word lines of eight sub-blocks can be selected simultaneously as described above, and data input/output eight bits at a time. In the 3D image processing described later, this construction permits effective data input/output.

Specifically, in a prefetch/preload type semiconductor memory device which is widely used in applications where high speed transfer is necessary, high speed is possible by using serial/parallel conversion, but the actual internal access takes place to plural addresses simultaneously. Hence, in the embodiment, 64 bit prefetch or preload is performed when the data in byte units is taken as one word, so the read or write start address may be considered as, for example, a prefetch or preload of eight times. When an address is assigned in the byte units, this case is limited to positions which can be divided by the number of words (bytes) which are simultaneously accessed, i.e., 0, 8, 16, 24. Further, plural words which are simultaneously accessed are fixed, as in a continuous eight addresses from the aforesaid start address.

In the semiconductor memory device of this embodiment, eight bytes, i.e., 64 bits specified by an arbitrary increment from 0 to 3 can be accessed in one operation, so in one bank, eight sub-blocks are provided and data is input/output eight bits at a time therefrom. For this purpose, in the sense amplifier column on the right-hand side, 128 pairs of complementary bit lines corresponding to the sense amplifiers are divided into 32 groups of four each, and selected by 32 YS selection lines to connect to the local input/output lines. Likewise, four pairs of local input/output lines and the corresponding YS selection lines are also provided in the sense amplifier row on the left-hand side. As there are eight of these sub-blocks, data input/output (read/write) is input in 64 bit units in one bank.

Figure 6:
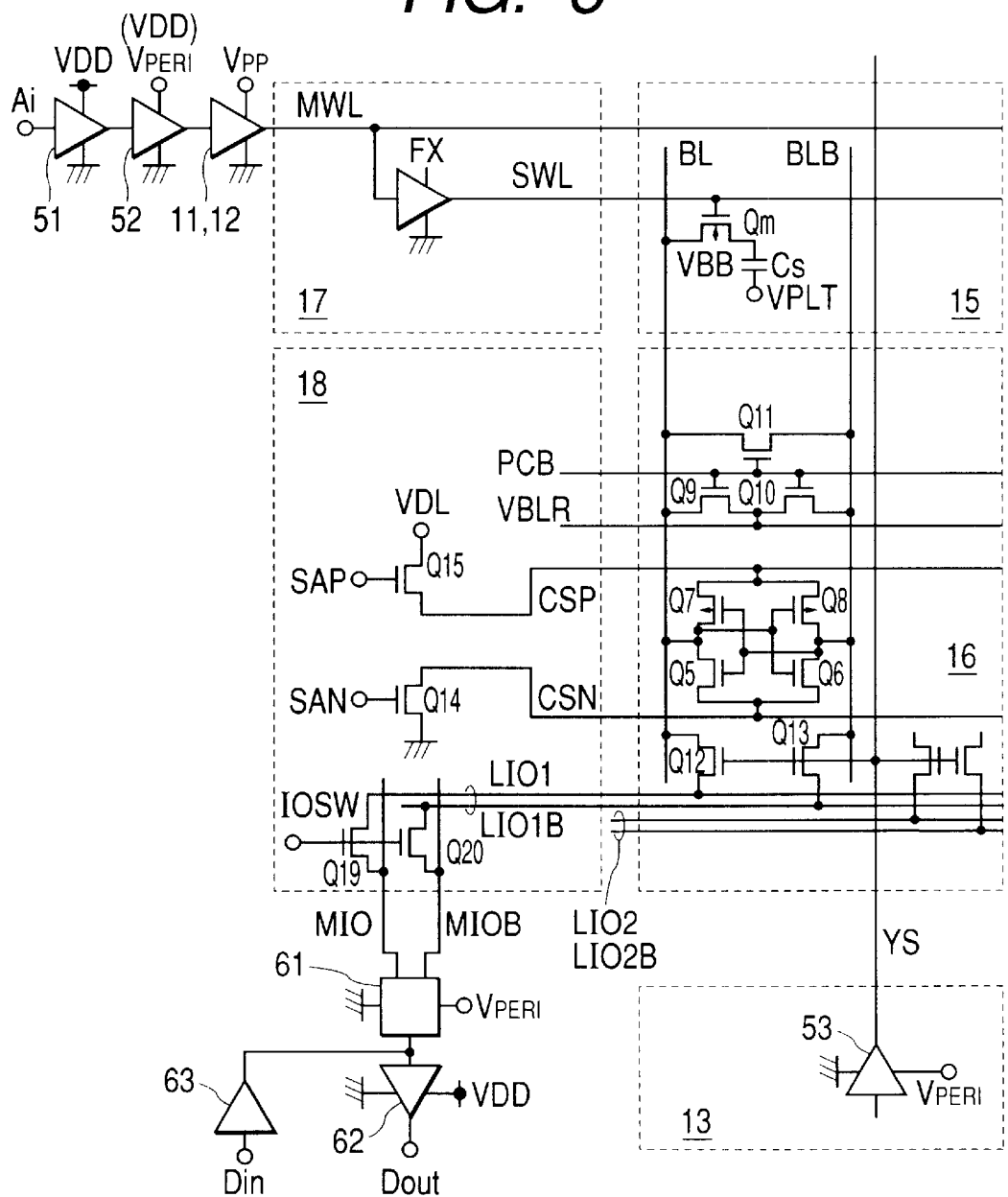
FIG. 6 is a circuit diagram showing one embodiment of the semiconductor device according to this invention.

FIG. 6 is a circuit diagram of one embodiment of the semiconductor memory device according to this invention. In this figure, a simplified circuit diagram is shown from the address input to data output centered on the sense amplifier group. This embodiment is designed so called for a two intersection point system wherein a pair of complementary bit lines double back and extend parallel centered on the sense amplifier. In this figure, a sense amplifier 16 provided in one memory mat 15, and a circuit provided in an intersection area 18 of intersection between the sense amplifier column and sub-word driver column are shown, the remainder being shown as a block diagram.

One dynamic memory cell is shown as an example provided between a sub-word line SWL provided in the memory mat 15, and a bit line BL which is one the complementary bit lines BL, BLB. The dynamic memory cell comprises an address selection MOSFETQm and storage capacitor Cs. The gate of the address selection MOSFETQm is connected to the sub-word line SWL, the drain of this MOSFETQm is connected to the bit line BL, and the storage capacitor Cs is connected to the source. The other electrode of the storage capacitor Cs is common, and a plate voltage VPLT is supplied thereto.

A negative back bias voltage VBB is applied to the substrate (channel) of the MOSFETQm. Although there is no particular limitation, the back bias voltage VBB is set to a voltage such as −1 V. The selection level of the sub-word line SWL is a high voltage VPP which is higher than the high level of the bit line by the threshold value of the address selection MOSFETQm.

When the sense amplifier is operated by an internal step-down voltage VDL, the high level amplified by the sense amplifier and supplied to the bit line is the internal voltage VDL level. Therefore, the high voltage VPP corresponding to the selection level of the word line is VDL+Vth+α. The pair of complementary bit lines BL, BLB provided on the left-hand side of the sense amplifier are disposed parallel shown in the figure. These complementary bit lines BL, BLB are connected to the input/output node of the unit circuit of the sense amplifier.

The unit circuit of the sense amplifier comprises a CMOS latch circuit comprising N channel amplifiers MOSFETQ5, Q6 formed as a latch by an intersection connection of the gate and the drain, and P channel amplifiers MOSFETQ7, MOSFETQ8. The sources of the N channel MOSFETQ5, Q6 are connected to a common source line CSN. The sources of the P channel MOSFETQ7, Q8 are connected to a common source line CSP. Power switches MOSFETQ14, Q15 are respectively connected to the common source lines CSN, CSP.

Although there is no particular limitation, an operating voltage corresponding to earth potential is supplied by the N channel power switch MOSFETQ14 provided in the cross area 18 to the common source line CSN to which the sources of the Nchannel amplifiers MOSFETQ5, Q6 are connected. Likewise, the N channel power MOSFETQ15 is provided which supplies the internal voltage VDL to the common source line CSP to which the sources of the P channel amplifiers MOSFETQ7, Q8 are connected. The power switches MOSFET may be distributed among the unit circuits of the sense amplifiers.

Sense amplifier activation signals SAN, SAP supplied to the gates of the N channel power MOSFETQ14, Q15 are signals of identical phase which are high level when the sense amplifiers are activated. The high level of the signal SAP is the signal of the level of the step-up voltage VPP. When VDL is 1.8 V, the step-up voltage is approximately 3.6 V, so the N channel MOSFETQ15 can be placed in a fully ON state and the common source line CSP set to the level of the internal voltage VDL.

A precharge (equalizer) circuit comprising an equalizer MOSFETQ11 which short-circuits the complementary bit lines, and switches MOSFETQ9, Q10 which supply a half precharge voltage VBLR to the complementary bit lines, is provided to the input/output node of the sense amplifier unit circuit. A precharge signal PCB is supplied to all of the gates of these MOSFETQ9–Q11. Although there is no particular limitation, an IO switch circuit IOSW (switches MOSFETQ19, Q20 which connect a local input/output line LIO and common IO (MIO)) are disposed in the cross area 18. Further, a half precharge circuit for the common lines CSP, CSN of the sense amplifiers and a half precharge circuit for the local input/output line LIO are also provided as described above.

The switches MOSFETQ12, Q13 comprise column (Y) switch circuits. When the selection signal YS goes to the selection level (high-level), the switches go ON, and connect the input/output node of the sense amplifier unit circuit (complementary bit lines BL, BLB) to the local input/output lines LIO1, LIO1B, LIO2, LIO2B. Due to this, the input/output nodes of the sense amplifiers amplify minute signals of the memory cells connected to the selected sub-word line SWL, and transmit them to the local input/output lines LIO1, LIO1B via the column switch circuits (Q12, Q13). The local input/output lines LIO1, LIO1B extend along the sense amplifier column. The local input/output lines LIO, LIO1B are connected to common IO (MIO, MIOB) led from the input terminal of the main amplifier 61 via an IO switch circuit comprising N channel MOSFETQ19, Q20 provided in the cross area 18.

An address signal Ai is supplied to an address buffer 51 corresponding to the row address latch. An X address signal incorporated in this address buffer is supplied to a predecoder 52 corresponding to the column decoder, and a selection signal of a main word line MWL is formed via a main low decoder 11 and main word driver 12. The address buffer 51 receives the address signal Ai supplied from an external terminal, and is operated by a power supply voltage VDD supplied from an external terminal. Although there is no particular limitation, the predecoder is operated by a step-down voltage VPERI (VDD) obtained by reducing the power supply voltage, and the main word driver 12 is operated by the step-up voltage VPP. This main word driver 12 may be a logic circuit with a level conversion function which receives the predecode signal. A column decoder (driver) 53 decodes the Y (column) address signal input via an address buffer corresponding to a row address latch, not shown, which was described above, and forms a selection signal YS corresponding to the column decoder.

The main amplifier 61 is operated by the step-down voltage VPERI (VDD). Although not shown in the figure, the output signal from this main amplifier 61 is transmitted to an output buffer 62 operated by the power supply voltages VDDQ, VSSQ supplied from an external terminal via the decoder output shifter, and the output signal of the output buffer 62 is set as Dout. A write signal Din input from an external terminal is acquired via an input buffer 63, and is written in one operation to a memory cell selected via the MIO, MIOB, LIO via a write amplifier contained in the main amplifier 61 in the figure, via a data input shifter which is not shown. The signals Dout, Din are output via the bi-directional interface.

Although there is no particular limitation, in the first example, the power supply voltages VDDQ, VDD supplied from the external terminal are set to 3.3 V, the step-down voltage VPERI (VDD) supplied to the internal circuit is set to 2.5 V, and the operating voltage VDL of the sense amplifier is set to 1.8 V. The selection signal (step-up voltage) of the word line is set to 3.6 V. The precharge voltage VBLR of the bit line is set to 0.9 V corresponding to VDL/2, and the plate voltage VPLT is also set to 0.9 V. The substrate voltage VBB is set to −1.0 V. The power supply voltage VDDQ supplied from the external terminal may be set to a low voltage of 2.5 V as a second example. When the power supply voltage VDDQ is as low as this, the step-down voltage VPERI (VDD) and step-down voltage VDL may both be set to the order of 1.8 V.

Alternatively, the power supply voltage VDDQ supplied from the external terminal may be set to 3.3 V, and the step-down voltage VPERI (VDD) supplied to the internal circuit and operating voltage VDL of the sense amplifier may both be set to 2.0 V or 1.8 V. Hence, the internal voltage may be set to various values relative to the external power supply voltages VDDQ, VDD.

Figure 7:
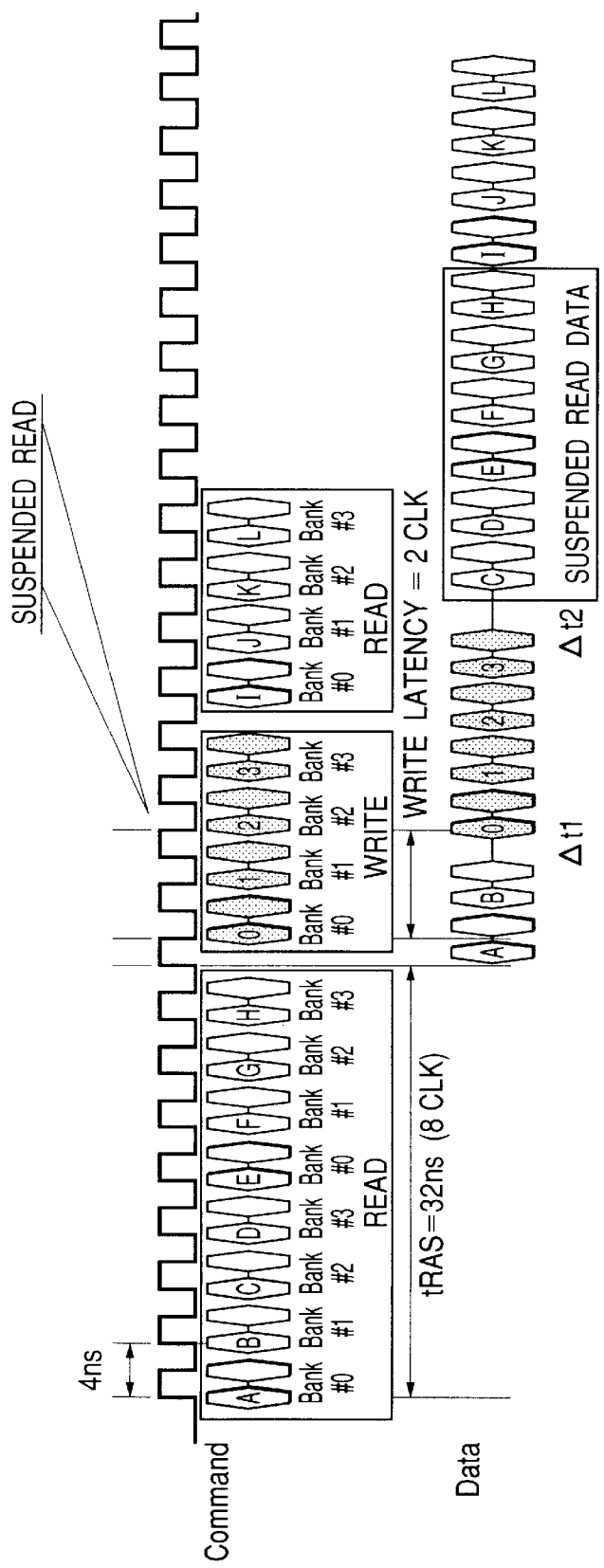
FIG. 7 is a timing chart for the purpose of describing an example of the operation of the semiconductor memory device according to this invention.

FIG. 7 is a timing chart which describes one example of the operation of the semiconductor device according to this invention. In this figure, prefetch or preload are performed using bank 0 (#0) to bank 3 (#3) of the eight memory banks as in the embodiments of FIG. 3 or FIG. 4, using the wait time (latency) from when commands are input to when read data are obtained.

The time required from when a command, row address and column address are incorporated in a latch from the command packet is 1 clock (1 CLK), and after decoding and selection of a word line, amplification by the sense amplifier and column selection, serial/parallel conversion and output, read data is output after a total of seven clocks. Hence, 8 CLK are used from command input to data output. If one clock period is 4 ns, data output is performed 32 ns after command input. In one memory bank, selection of the memory mat is terminated after four clocks, so the next command can be input.

Therefore, in the example of the figure, if a first read command is input by specifying four addresses A, B, C, D using bank 0 to bank 3, and a read command is then input by specifying addresses E, F, G, H relative to the bank 0 to bank 3, data is sequentially output as bi-directional bus DATA 32 bits at a time in synchronism with raising and falling from the 9th clock.

In this embodiment, when an address and a write command are input using bank 0 to bank 3 in the data output for bank 0, write data input from the bi-directional bus DATA is acquired after a specially set write latency (2 CLK). Normally, the acceptance of data input from a write command input performs the aforesaid preload, so one clock is sufficient.

However, according to this embodiment, an order of priority is assigned between data read and data write as described above, so there is always a priority for write data input and read data input. Therefore, the input of write data is always processed with the same timing from an internal operation, and the output of read data having the same timing as input, waits until input is complete. To realize this control, the change-over wait time of the bus is set. Specifically, output of data corresponding to the address B of bank #1 is terminated during the read, the output buffer is set to high impedance, and after opening the bi-directional bus, input of write data is performed from the host side.

To ensure a change-over time Δt1 so that there is no competition between output data in the read mode and input data in the write mode, an extra 1 CLK is permitted to the Write Latency to give 2 CLK, as described above. Hence, 32 bits×8 write data is input corresponding to the four banks after the read data as the bi-directional bus DATA. When this write operation is terminated, the suspended read data is automatically output.

Also, during output of the suspended read data, a timing is set so as to ensure a change-over time Δt2 such that input data and suspended output data do not compete on the bi-directional bus DATA. In order to obtain the next read data, a reverse calculation may be performed from the number of write commands and the final output data H of the read data after the write operation, and the third read command input by specifying the four addresses I, J, K, L using bank #0 to bank #3 eight clocks ago.

The timing set period for setting Δt1 and Δt2, is provided to prevent the memory itself or the memory controller from acquiring a wrong signal when write data input is performed with a timing such that there is no separation interval immediately after the read data, or conversely when read data is output from a timing immediately after termination of read data input. The memory does not operate independently on its own, but exchanges data between the memory controller and the CPU, so its setting depends on the relation with other circuits which perform data input/output with the memory.

Therefore, it is necessary to set the timing specification period so as to provide Δt1 and Δt2 according to devices which perform data input/output with the semiconductor memory device according to this invention, and the bi-directional bus which connects these devices. In this regard, according to this embodiment, the write latency may be set at one half clock of the clock signal. Specifically, a register is provided to set the write latency, various settings such as 2.5 CLK or 3 CLK being possible in addition to the 2 CLK according to the information bits set therein. After the write operation due to this interruption is terminated, the output timing of the remaining data for which read has been suspended can also be set by one half clock of the clock signal by setting the information bits in an identical register to the above.

When the clock is extremely fast, the time required to turn off the data output buffer to change over from data output to data input cannot be ignored. In the semiconductor memory device according to this invention, the delay time from the start of interruption of data output to the start of data input can be set arbitrarily in the internal register, therefore an optimum wait time may be used according to the clock speed, turn off time of the output buffer and bus length. For example, interruption of data starts in the raising edge of the next clock input by the command. If the delay amount set by the internal register is zero clocks, data input is started from the time when interruption of data output begins, and if the delay amount from the start of data output interruption to the start of data input is set, data input starts after a number of clocks according to the delay amount. It will of course be understood that in the case of a DDR system which uses the raising and lowering edges of the clock in data transfer, interruption of data output may be performed from the falling edge of the next clock for which a command is input.

When the register described above is used, this may be done by an initial setting when it is mounted on the system, or it may comprise the information bits in the write command. Instead of this construction, information bits may be supplied in a fixed form from an external terminal. In this case, the number of external terminals increases, but as the setting of the information bits is implemented by hardware when the memory is mounted on the system, there is no need to initialize immediately after the power is switched on or to insert detailed information bits in the command.

According to this embodiment, by providing the timing specification period and interruption control from the write circuit to the read circuit, almost continuous read and write internal operations can be performed except for the bus change over delay, so the effective throughput when read and write are performed alternately is considerably improved. From the viewpoint of finer details, priority processing of this write data input leads to an increase in the read operation data output wait time immediately before a write operation. However in the case of applications affected by throughput problems, a FIFO memory buffer is usually provided, so the effect of increase of the detailed output wait time on overall system performance can be considered small.

Although there is no particular limitation, according to this embodiment, it was shown that input of a write command can be delayed by half a clock relative to a read command, however the write command may also be input by the raising of a clock CLK in the same way as a read command. Correspondingly, data can be input 32 bits at a time in the raising and falling of the clock CLK.

Figure 8:
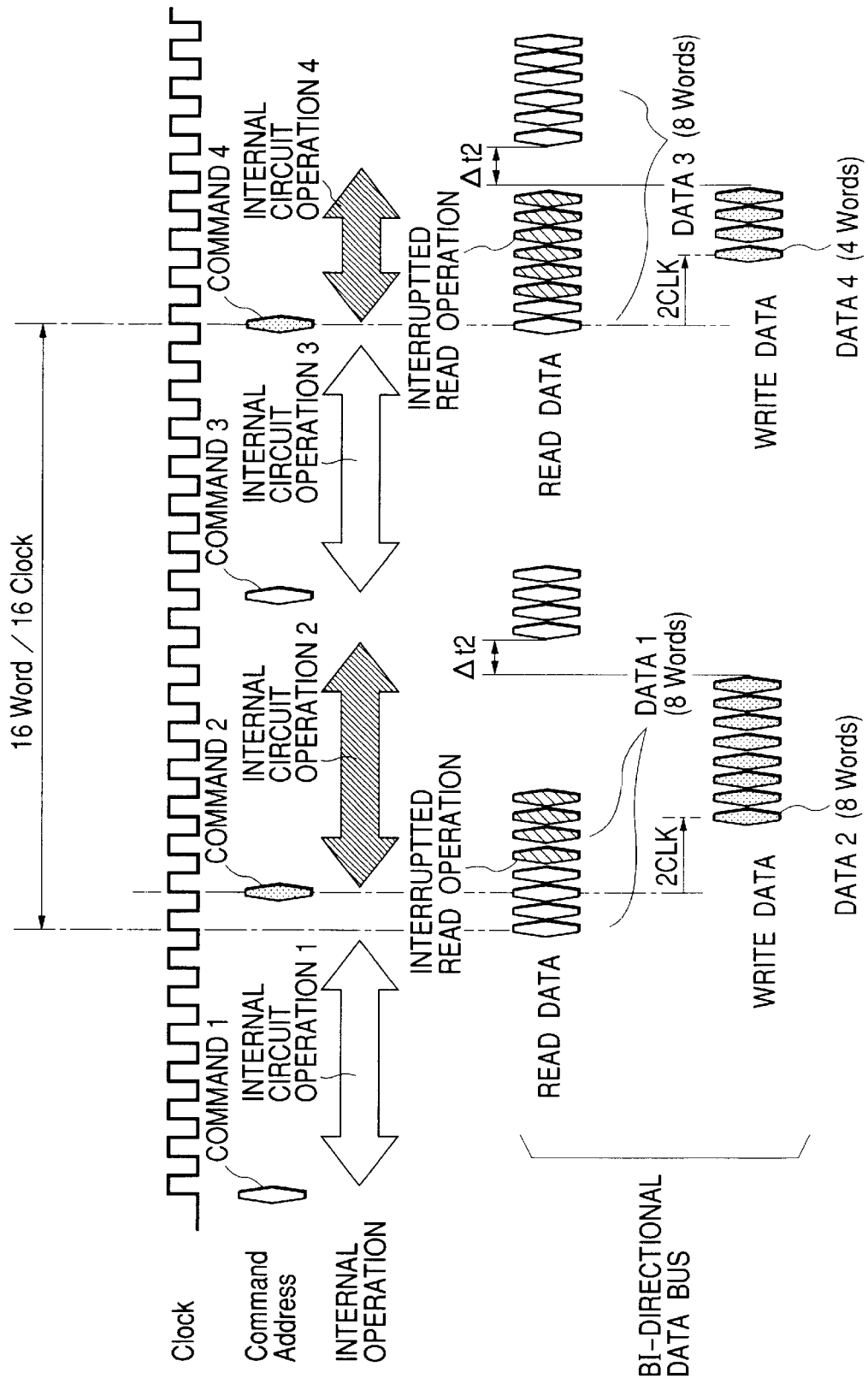
FIG. 8 is a timing chart for the purpose of describing another example of the operation of the semiconductor memory device according to this invention.

FIG. 8 is a timing chart describing another embodiment of the operation of the semiconductor memory device according to this invention. In the figure, a burst operation shown in the embodiment of FIG. 4 is used. In the burst operation, data can be input with a word length corresponding to the bit width of the bi-directional bus in one memory bank, and continuous operation of data output can be performed, by one command.

In this embodiment, a burst length of 8 is specified by one command 1, and 8 data are continuously output from the bi-directional bus after 8 clocks. The column address for this continuous read is generated by the burst counter. In this embodiment, a command 2 is permitted which specifies a write operation during burst read corresponding to the command 1. For example, if the clock signal CLK in which data of three word lengths is output to the bi-directional data bus, i.e., the command 2 is input in synchronism with a clock delayed by 1 CLK from when the initial read data is output, write data is input from the bi-directional data bus delayed by 2 CLK.

Using the 2 CLK period, the third and fourth data already transferred to the data output shifter are output, and the column addresses held in the burst counter are stored in an address hold register. Write data input with the above delay of 2 CLK can be transferred using the output buffer as an output high impedance after the fourth data is output. The interrupted read data is held in the sense amplifier. If the burst length is 8 due to the command 2, it is preloaded two words at a time, and write in two word units is performed four times continuously.

After the time Δt2 set as described above has elapsed after termination of the write operation, the interrupted read data is output. Specifically, after an internal operation 2 corresponding to the command 2 is terminated, a column address in the address hold register is set in the burst counter, and read data which was stored in the sense amplifier is output.

In the case of the internal operation 2 corresponding to the command 2, and if it does not affect the final data output in the interrupted read operation, input of a command 3 is permitted, a corresponding internal operation 3 is executed, and a burst operation is then performed. A latency of the eight clocks is set from input of the command 3 until read data is output to the bi-directional data bus. When a command 4 is input immediately after the end timing of this internal operation, and a burst length 4 is specified to indicate a write operation, two words of data are output wherein read preparations have been performed by the internal operation 3 in a 2 CLK interval, the column addresses corresponding to the interrupted read data are evacuated to the address hold register, the output buffer becomes output high impedance, the bi-directional data bus is opened, and four words of write data are input.

In this embodiment, when data input/output is performed in the DDR mode, 16 words of write data and read data can be input/output during 16 clock periods, and high-speed data input/output operation such as 1 word/1 clock can be realized.

In this way, during memory access when read and write operations are alternately repeated in one memory bank, high-speed data input/output is possible due to the application of this invention.

Figure 9A:
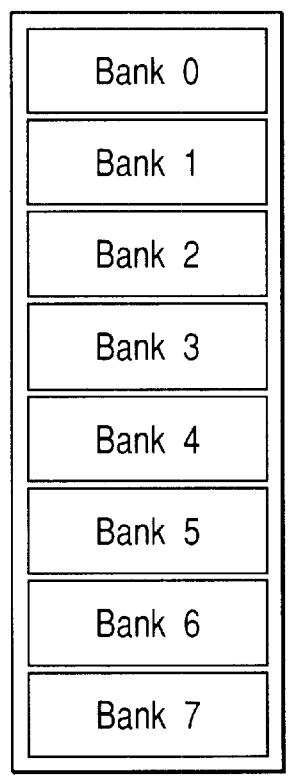
FIG. 9 is an image mapping diagram in one embodiment of the semiconductor memory device according to this invention.
Figure 9B:
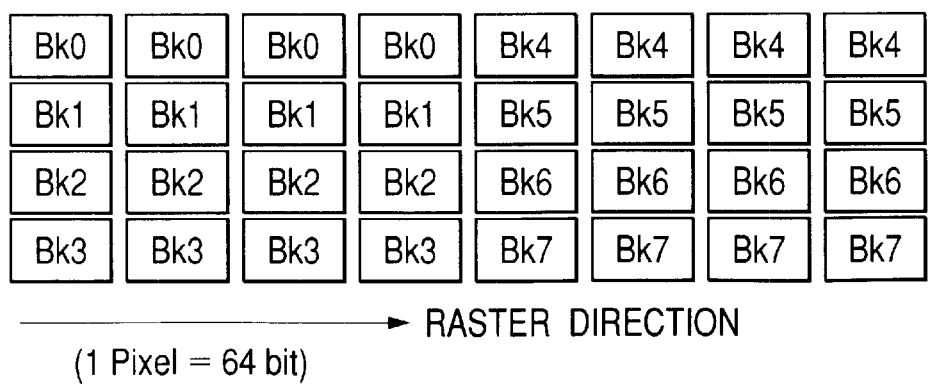

FIG. 9 shows a pixel mapping diagram of one embodiment of the semiconductor memory device according to this invention. Using the eight memory banks 0 to 7 which can be accessed independently as described above, four pixels each are assigned to the same bank in the raster direction of a CRT display, and different banks are assigned to each pixel by repeating every four pixels in the raster and perpendicular directions. In this memory, the time required for one access is 1 clock, the wait time when the same bank is successively accessed, i.e., tRC, is four clocks, and a high-speed function is provided for continuous bank access.

Specifically, plural memory mats forming the banks which can function independently, and a mechanism which, after an operation following a first read command or write command, lowers a word line in a memory mat in which a read or write was performed in a bank specified by the read or write command and automatically performs a sequence of operations which precharges a group of sense amplifiers, are provided. A mechanism is also provided which, when a second read or write command is issued to the same bank immediately after the read or write command, extends a sequence of operations starting from the automatic raising of the word line to the termination of the second read or write command issued immediately afterwards.

Further, a command control mechanism is provided wherein, when a second read command is issued to the same bank immediately after the first read command, the address of the mat specification/word line specification in the second command is ignored, and address data specified by a column address part of the second command is output from the sense amplifier group activated by the first read command. When a second write command is issued to the same bank immediately after the first write command, the address of the mat indication/word line indication in the second command is ignored, and data input to an address specified by the column address part of the second command from the sense amplifier group activated by the first write command can be written.

In a memory for image processing, if the mapping of the embodiment of FIG. 9 is applied, continuous operations in which there is no waiting for memory operations whatever the angle can be performed on one drawing having a width of one pixel, which is the most basic graphics drawing operation.

For example, for a vertical line drawing, the same bank appears four pixels, i.e., four clocks later. As this is equal to tRC, bank 0 can be accessed for example from when bank Q was initially accessed to when it is next accessed.

For example, for a horizontal line drawing, the same bank continues for four pixels, and to access continuous addresses in the same bank, the high-speed mechanism is effective, so each pixel can be accessed by one clock. Further, in the horizontal direction, the same bank is disposed four pixels at a time, so if a long line is drawn in the horizontal direction, the same bank is accessed four pixels, i.e., four clocks later. As this is equal to tRC, bank 0 can be accessed for example from when bank 0 was initially accessed to when it is next accessed.

For example, for an arbitrary sloping line, a combination of the above two cases may be considered. Therefore, for drawings in all directions, access to the same bank is ensured at an interval of at least tCR excepting when the high-speed function is used.

In the semiconductor memory device according to this invention, instead of forming the device of large bit units having a long bit length (64 bits in the aforesaid example) which is a multiple of a prefetch/preload word (32 bits in the aforesaid example), the length is the same as the bit length of the external bus, or plural storage circuit blocks which are less than a multiple of the preload/prefetch words and comparatively small are used and driven simultaneously. A circuit is provided to increment the addresses given to these storage circuit blocks if necessary by the three lower bits and the access mode.

For example, as shown by the address assignment to the storage circuit blocks in FIG. 10, a function wherein addresses increased two at a time are continuously accessed is mapped so that even numbers and odd numbers are arranged alternately in neighboring addresses in the same storage circuit blocks (the sub-block of FIG. 5). For example, in sub-block 0, the address assignment is 00, 09, 16, 25, and in sub-block 1, the address assignment is 01, 08, 17, 24.

It should be noted that in the address assignment corresponding to the eight sub-blocks 0–7, the first row is 00–07, the second row is 08–15, the third row is 16–23 and the fourth row is 25–31. These are not arranged in order corresponding to the order of the sub-blocks 0–7, i.e., the addresses of the second and fourth rows are 08–15 and the addresses of the first and third rows are 25–31, so addresses can be exchanged between neighboring sub-blocks according to the aforesaid rules. This is an effective result from the viewpoint of high-speed, efficient data input/output in the image processing described hereafter.

In addition to continuous access of odd and even byte data, odd-even or conversely even-odd, only odd or only even, various combinations are possible by combining the address assignments of sub-blocks and setting skip address indications by a register.

Figure 11:
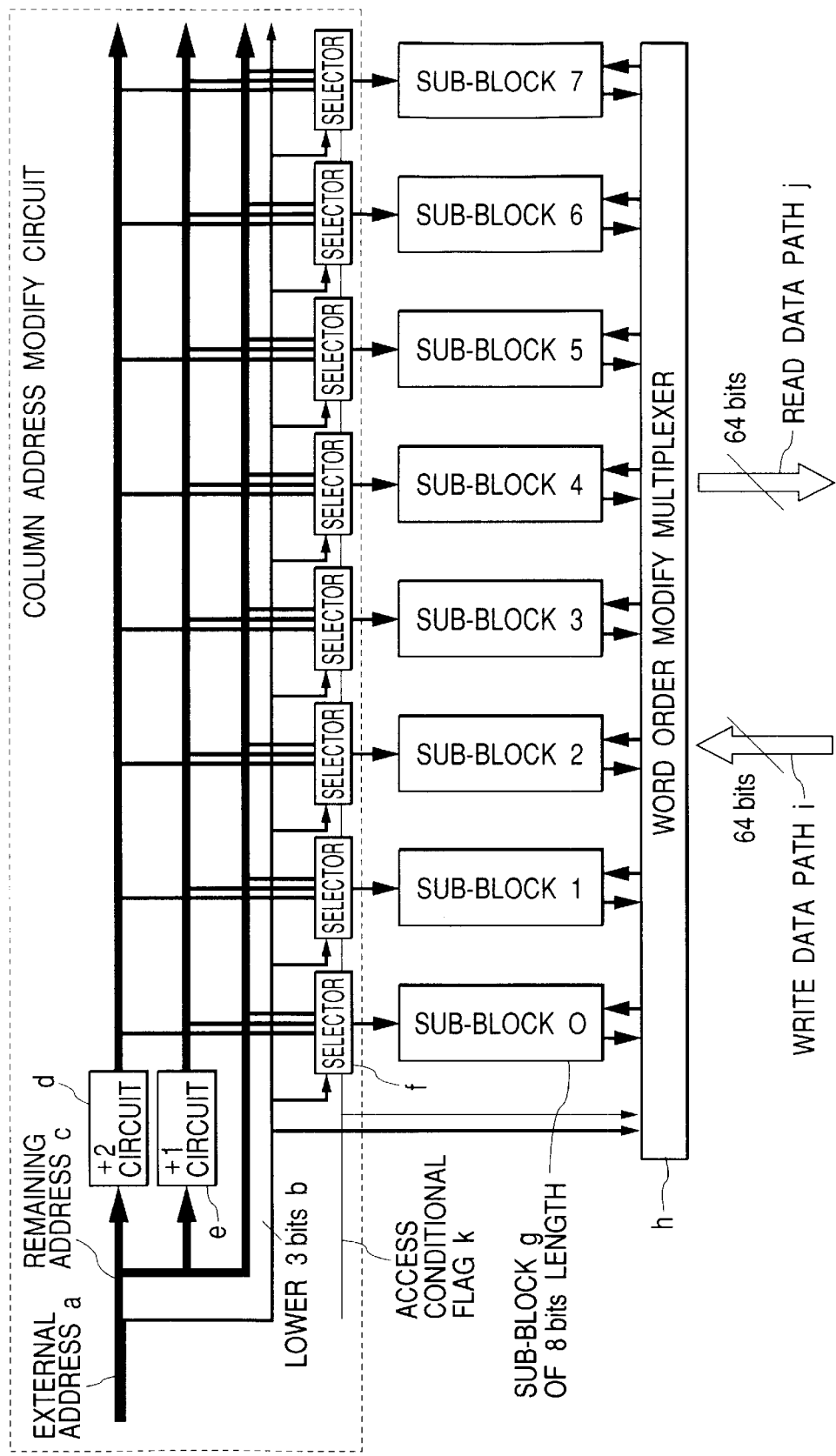
FIG. 11 is a schematic view showing one embodiment of a memory circuit block part corresponding to a memory bank in the semiconductor memory device according to this invention.

FIG. 11 is a schematic view of one embodiment of a storage circuit block part corresponding to one memory bank in the semiconductor memory device according to this invention. The storage circuit block part comprises storage circuit blocks shown in FIG. 5 which are memory accessed in eight bit units, i.e., sub-blocks 0 to 7. The addresses given to each sub-block 0–7 are selected by the three lower bits of the address and an access mode flag from an external address excluding the three lower bits, external address +1 excluding the three lower bits and external address +2 excluding the three lower bits. The address of the three lower bits is an address specified by eight sub-blocks, as in 00–07 shown in FIG. 10, and is an address assigned by one byte (eight bits) of data.

In the data output from the sub-blocks 0–7, the value of the address of the three lower bits and the upper/lower position of the word address relative to a 64 bit bus, varies, hence a word order modify multiplexer is provided. This word order modify multiplexer modifies the order of word addresses within 64 bits. The word order modify multiplexer comprises an independent circuit in this embodiment, but it may also form part of the serial/parallel or parallel/serial conversion circuit in FIG. 3 or FIG. 4.

FIG. 10 is a mapping diagram of addresses assigned to data in sub-blocks as described above. In the addressing mode of this embodiment, there are two types of access, i.e., even and odd, wherein continuous addresses and the start address were increased by +2 at a time. In this case, in the sub-blocks 0–7, odd numbers and even numbers are mapped so that they are arranged alternately in neighboring addresses in the same sub-block. In this embodiment, each storage circuit block stores four words at a time, but may of course also store any number.

When the starting address in the continuous access mode is 02, an external address excluding the three lower bits is input as it is to the sub-blocks 2–7 by the selection circuit f of FIG. 11, and +1 is input to the memory blocks 0–1. Also, the word order modify multiplexer is changed over so that the output is in the order of sub-blocks 2–7, 1, 0. In this way, according to the address mapping diagram of FIG. 10 in the sub-blocks 2–7, six bytes of data in 02–07 are output. For the sub-blocks 0 and 1, the address is +1, 09 and 08 are selected and the order is sub-blocks 2–7, 1, 0 due to the word order modify multiplexer. As data, eight bytes (64 bits) such as 02–09 are selected, and 02–05, 06–09 are output serially in the DDR mode to the data output shifter.

In this embodiment, although prefetch is performed in 64 bit units as described above, the invention is not limited to positions cut by the number of words (bytes) which are simultaneously accessed such as 0, 8, 16, 24 as when an address was assigned in byte units as in the prior art, but continuous eight addresses may be read or written from addresses assigned to arbitrary byte units.

When the start address in the +1 access mode is 05, an external address is input as it is excluding the three lower bits in the sub-blocks 5, 7 by the selection circuit f in FIG. 11, +1 is input to the sub-blocks 0, 2, 4, 6, and +2 is input to 1, 3. Also, the word order modify multiplexer is changed over so that output data from the sub-blocks 5, 7, 0, 2, 4, 6, 1, 3 is arranged in order. Specifically, 05 and 07 are output from the sub-blocks 5, 7, and 09, 11, 13, 15 are output from the sub-blocks 0, 2, 4, 6, and 17, 19 are output from the sub-blocks 1, 3. By changing the order using the word order modify multiplexer as described above, the data 05, 07, 09, 11, 13, 15, 17, 19 is output. In this way, eight words of continuous or alternate addresses from an arbitrary starting address are output to a 64 bit data bus or input from a 64 bit data bus.

The above address mapping diagram assigned to data is suitable for a 3D graphics system in the Z buffer method. Specifically, R, G, B image data is assigned to four bytes having even addresses 00, 02, 04, 04, the depth coordinate Z is assigned to three bytes having 01, 03, 05, a pixel transparency α is assigned to one byte at 07, and image data and Z data are stored in alternate addresses. When a R color pixel is assigned to the 00 byte, G is assigned to the 02 byte and B is assigned to the 04 byte, the 06 byte is empty (if necessary, brightness information Y).

If this address mapping is performed, in a memory circuit of the prior art, as only continuous data can be accessed, even during screen refresh access which does not require Z buffer data, useless Z buffer data is accessed and the effective transfer efficiency falls to 50%. This is a fatal situation for 3D graphic systems which require high-speed processing. In this embodiment, by implementing the +1 access mode, only image data or Z α data may be continuously input/output from an arbitrary address. Hence, even regarding initialization of the image buffer, high-speed processing can be performed even in systems where the "Z value representing the furthest away", and "background color" are different.

When a system is constructed from a 128-bit data bus by connecting four of the semiconductor memory devices according to this embodiment in parallel, 128 bits of data can be input/output in one access. In this construction, during very fine graphics processing wherein there are four pixels/polygon, i.e., 2 horizontal (raster direction) and 3 vertical on the display screen, two pixels of image data in the horizontal direction and Zα can be input/output by one access, so it is suitable for high-speed graphics processing. In the +1 access mode, i.e., the skip access mode, four pixels of data excluding Zα can be output in one operation.

Figure 12:
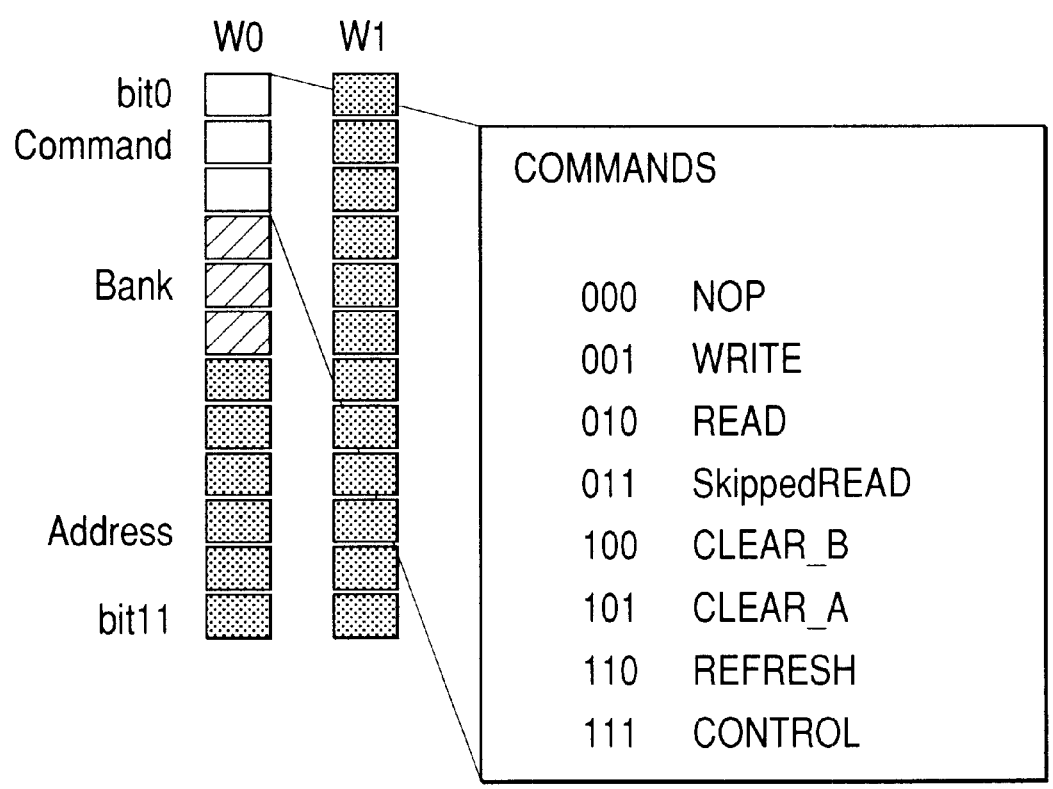
FIG. 12 is a schematic view of commands showing one embodiment of the semiconductor memory device according to this invention.

FIG. 12 is a schematic view of commands in one embodiment of the semiconductor memory device according to this invention. There are 12 control terminals assigned as described above. A packet construction is adopted wherein two sets of control signals are input in synchronism with the edge of a clock to these control terminals. Specifically, a first signal (first type of signal) W0 is input in synchronism with one or both of the rising and falling of the clock CLK, and a second signal (second type of signal) W1 is input in synchronism with an edge delayed by half a period in of the case of both the falling or rising of the next clock following the first signal W0. A layer structure is adopted wherein one command specifies a memory operation by these two signals W0, W1.

The advantage of this layer structure is that it permits logical signal input for different operations by distinguishing signals required at an early stage such as high-speed memory operations or a series of memory operations, and signals which appear at a later stage such as in low speed memory operations or the memory operations. Due to this construction, by combining the above two signals, multiple control operation commands may be input in one operation from a small number of external terminals.

To the first signal W0 (or first type of signal) which is initially input, eight commands are assigned using three bits from 0 to 2. These commands are as shown in the figure, and their operations may be described as follows.

(1) NOP is no operation, meaning that no operation is performed.

(2) WRITE is the write mode. A write operation has a latency of 2 and a burst length of 2 (preload), and takes precedence over the next read operation. If the same bank continues to be accessed immediately afterwards, auto precharge is interrupted.

(3) READ is the read mode. A read operation has a latency of 8 and a burst length of 2 (prefetch). If it collides with the write mode, output operations are interrupted, and data which has not yet been output is automatically output after termination of the write operation. If the same bank continues to the accessed, auto precharge is interrupted as in the case of the aforesaid write mode.

(4) Skip read is the skip read mode. This is an alternate read operation as in reading odd bytes or even bytes, and odd or even is determined by the lowermost bit of the address. Hence, in the semiconductor memory device of this embodiment, addresses with the lowermost three bits specifying each byte may also be input regardless of data input/output in 32 bit (4 byte) units.

(5) CLAR-B performs a clear operation. If NOP, the timing of the next CLAR-B terminates the clear sequence.

(6) CLAR-A performs a clear operation after loading cleared data. The remaining features are identical to those of CLAR-B.

(7) REFRESH starts auto refresh. One mode specifies the bank and another mode does not specify the bank. These modes are changed over by the uppermost bit of the lower address.

(8) CONTROL is the control mode. In combination with signals other than the first signal W0, ① Starts self refresh (e.g., by performing high-level/low level of the chip select CS after termination of self refresh). ② ON/OFF control of DLL. ③ Reset of DLL. ④ Start of test mode. ⑤ Reset (returns to power supply switch-on state) The ⑤ test mode specifies various test modes using the 12 bits of the second signal.

The (1)–(7) are high-speed operation commands. When one of them is specified, 3 bits from bit 3 to 5 of the first signal W0 are used to specify the bank, while the remaining 6 bits, and the 12 bits of the next signal W1, are used as an address signal. In this case, an upper address required to select the main word line is input to the first signal W0 which is input with an early timing, and if timing can be delayed as in the case of addresses which select plural sub-word lines assigned to one main word line, the second signal W1 is assigned, and all column addresses are assigned to the second signal W1.

Figure 13:
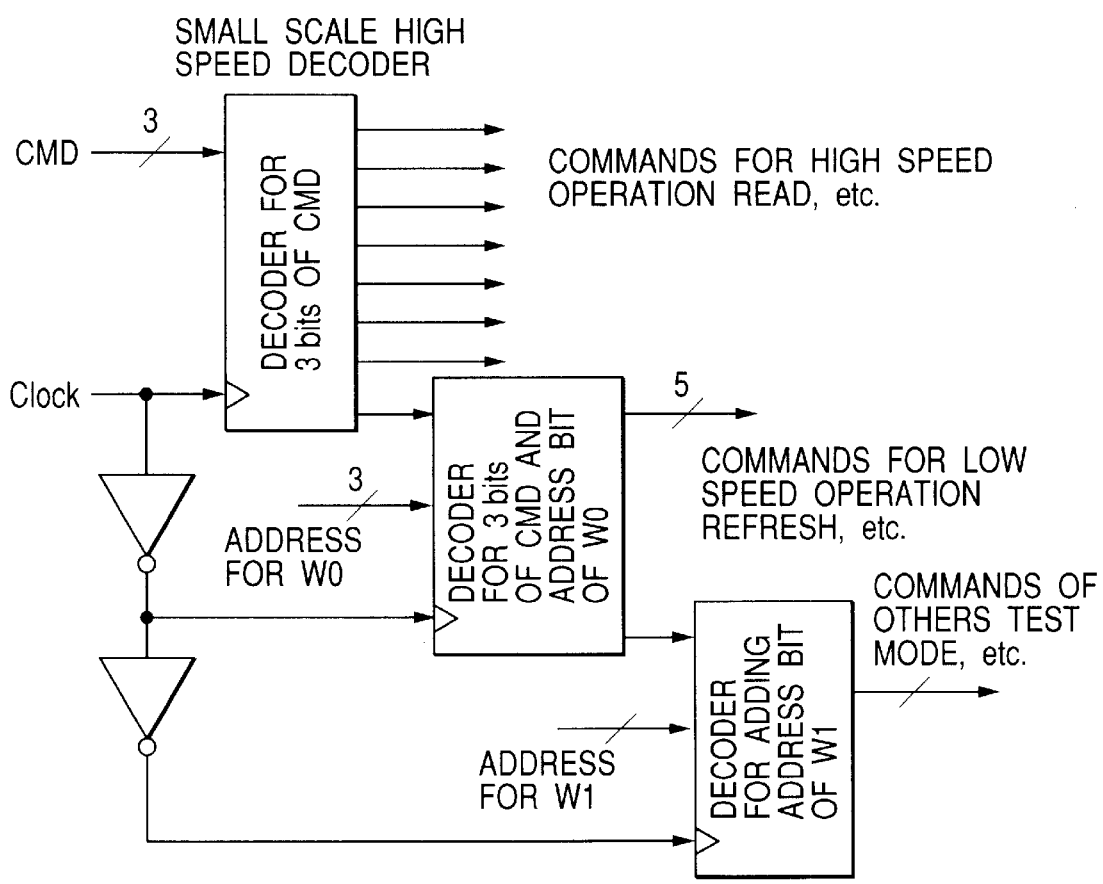
FIG. 13 is a block diagram showing one embodiment of a command decoder provided in the semiconductor memory device according to this invention.

FIG. 13 is a block diagram of one embodiment of a command decoder provided in the semiconductor memory device according to this invention. A command CMD comprising the three bits is acquired by a first command decoder, and the high-speed operation commands (1)–(7) excluding (8) CONTROL are decoded. The remaining decode signal (8) CONTROL output from the command decoder is supplied to a second decoder together with a 3 bit address signal of the first signal W1, and a low speed operation command, for example refresh, is specified.

When the test mode of ⑤ is specified by the second decoder, internal operations which are sufficient even at low speeds are indicated such as plural test modes due to a third decoder which receives the second signal W1.

In a packet command having the aforesaid layer structure, a control command comprising three bits is used to specify a memory operation as in the (1)–(8), and the remaining 21 bit signal is used for bank specification or as an address signal according to the results of the command, or for refresh or test. Consequently, these signals may be referred to as additional commands or additional bits. In other words, the command structure of this embodiment comprises a combination with some type of information signal used as a command for the operation of the memory itself. Therefore, the first signal or first type signal W0 comprises a main operating control signal, and the second signal or second type signal W1 which is attached to the first signal or first type signal W0, is meaningful, and has the role of providing additional bits, additional information or detailed operation.

In the field of 3D graphics, a high-speed semiconductor memory device is desired. In this field, images are becoming finer with one image comprising a very large number of polygons comprising a very small number of pixels, e.g., about 1 to 5 pixels. In many cases, to generate such an image, the Z buffer method is used. In the Z buffer method, a Z value which is depth data is added to each pixel on the image buffer, and compared with the Z value already written when the pixel was written. Additions are made only to pixels further in front, so only planes from the viewpoint of overlapping objects are generated on the image buffer.

When using the Z buffer method, before writing the first pixel, it is necessary to initialize all the Z buffers at least by "the value which expresses the furthest." Otherwise, it may occur that a pixel which should actually be written cannot be written due to the wrong Z value. Also, it is necessary to fill in pixel data with "the furthest color", i.e., a background color. As the whole screen is not necessarily covered by polygons, this is necessary to prevent pixel values which were not written when the image was generated from being indeterminate. To display the image thus generated, an ordinary CRT is used. ACRT is presently capable of the finest resolution, but as it has no image memory function, the image buffer must be read for periodic display.

In recent years, to generate high-resolution 3D images, image buffers are used in a quasi-random form, and frequently have an auto-precharge function which automatically performs precharge immediately after access. However, in this precharge function, auto-precharge is performed even when access occurs in the same page (word line) immediately after a first access, so a delay time occurs in the memory access. Regarding the above image buffer initialization, as "the Z value furthest away" and "the background color" differ depending on the system, so zero clear cannot be built into the memory. Hence, there was no option but to perform ordinary write, or to simultaneously write 8 addresses using block write, and a long time was required for buffer initialization.

Figure 14:
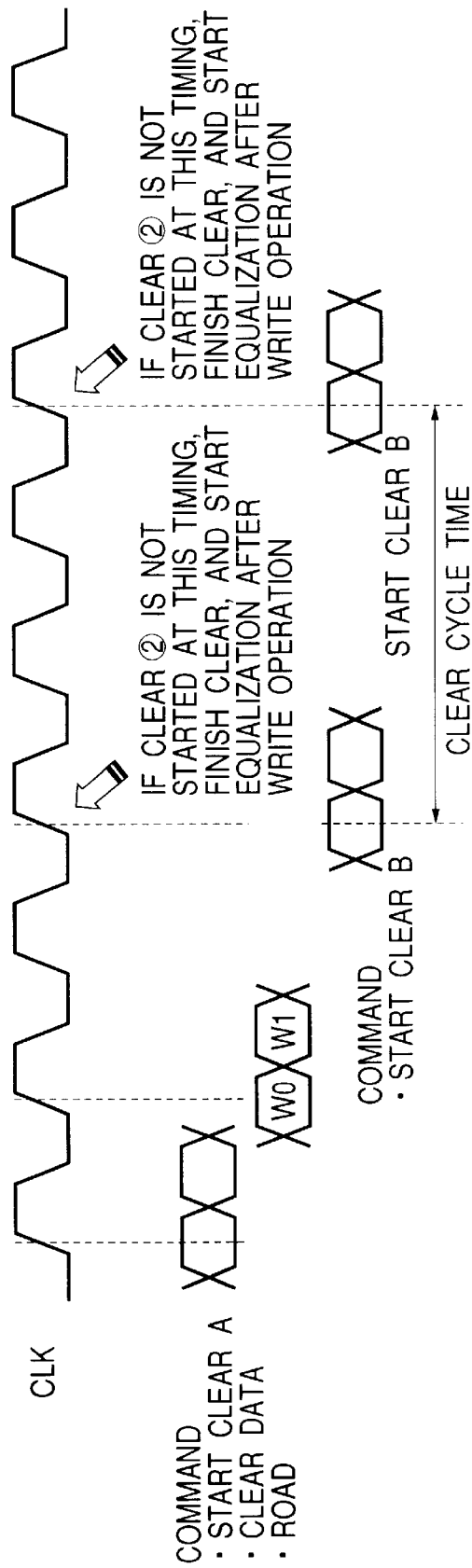
FIG. 14 is a timing chart showing one embodiment for the purpose of describing a clear function provided in the semiconductor memory device according to this invention.
Figure 15A:
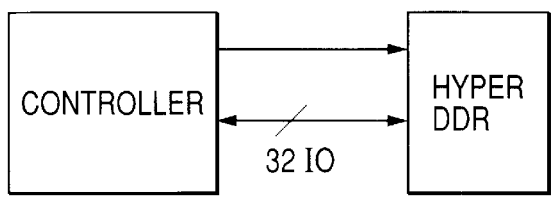
FIG. 15 is a system chart of one embodiment using the semiconductor memory device according to this invention.
Figure 15B:
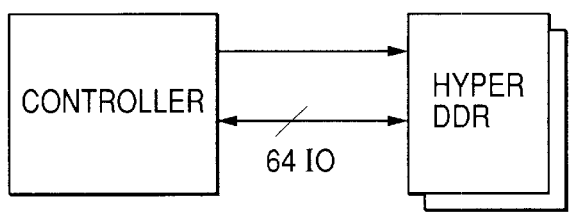
Figure 15C:
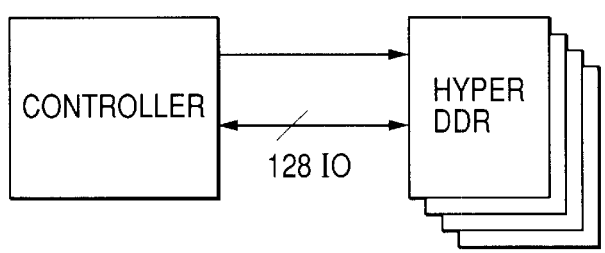
Figure 15D:
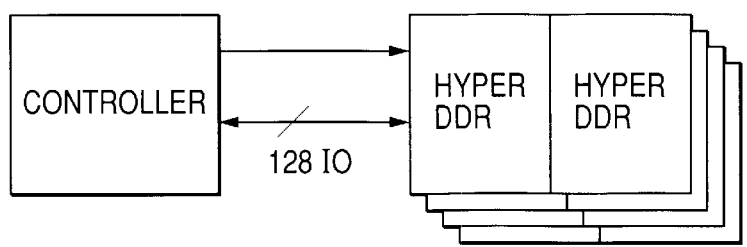

FIG. 14 is a timing chart of one embodiment for describing the clear function of the semiconductor memory device according to this invention. Clear data is input by the (6) CLEAR-A. Clear data is input by specifying CLEAR-A with the next command input timing having 1 CLK delay. Specifically, clear data is input in 64 bits (8 bytes), 32 bits (4 bytes) at a time, 2 clocks after command input of the CLEAR-A, and is written to the sense amplifiers. In this embodiment, by inputting CLEAR-A twice in succession, zero clear is input corresponding to the 16-byte "Z value furthest away" and "background color". When the CLEAR-A command is input to the same page (word line) on the same bank as described above, the auto-precharge function stops and the word line remains selected, so clear data can be rapidly loaded in synchronism with the clock CLK.

If a CLEAR-A or CLEAR-B command is input after a 2 CLK write latency from input of the last CLEAR-A command, the clear operation is terminated, and equalization (auto-precharge) after the write operation is automatically performed. When a CLEAR-B command is input as in this embodiment, the sense amplifier remains in the operating state, and only the word line is selected by an address specified by CLEAR-B. In this way, clear data can be transferred (copied) in word line units. If the CLEAR-B command is not input after a number of clock cycles, in this embodiment 4 CLK, required for selecting the word line, the clear operation is terminated. When the next CLEAR-B command is input as shown in the figure, the sense amplifier remains in the operating state as described above, another word line is selected, and the transfer or copy of clear data described above is performed.

In this way, clear data for one word line (sub-word line) is loaded by the CLEAR-A command, and initialization of the image buffer can be performed in a short time depending on the system, even when "the Z value furthest away" or "background color" for one memory mat is different according to the system, by repeating the CLEAR-B command.

FIG. 15 shows the system construction used by the semiconductor memory device according to this invention. In this diagram, a controller is a host comprising a central processing unit (CPU) or image processor, or a multi-processors which combines these elements. A semiconductor memory (HyPerr DDR) is a semiconductor memory device according to this invention, and permits input/output of data in 32 bit units in the DDR mode as described in the preceding embodiment.

In the system of (a), one controller and one memory are connected by a bus which transfers a 32 bit bi-directional bus and control line/differential clock (system clock)/command packet. If there is a storage capacity of 84 M bits (8 M bytes) as described above, and the device is operated at a clock of 250 MHz, data transfer can be performed at 2 GB (Gigabyte)/s (seconds) with a storage capacity of 8 MB.

In the system of (b), two memories (HyPer DDR) are Am connected inparallel, and a 64 bit bi-directional bus is used. Hence, the storage capacity is increased to 16 MB, and the transfer rate can be increased to 4 GB/s.

In the system of (c), four memories (HyPer DDR) are connected in parallel, and a 128 bit bi-directional bus can be used. Hence, the storage capacity is increased to 32 MB, and the transfer rate can be increased to 8 GB/s.

In the system of (d), four memories (HyPer DDR) are connected in parallel, the storage capacity is increased to 64 MB by combining two sets, and a 128 bit bi-directional bus can be used. In this way, the transfer rate can be increased to 8 GB/s.

The advantages obtained by the above described embodiments are as follows.

(1) Read data is output to a data terminal in a data read operation in synchronism with a synchronization signal and write data is input in a data write operation via the data terminal in synchronism with a synchronization signal, in a first time period when the output of read data to the data terminal should be performed, the input/output operation which permits input of write data via the data terminal is permitted, a second time period after a write operation until the input of a write data is started, and a third time period when the input of write data is performed are provided, and output of said read data to the data terminal is permitted within the second time period. Therefore, a semiconductor memory device suitable for high speed operation and 3D imaging can be obtained.

(2) The read data comprises plural bits which should be output sequentially according to a timing determined by the synchronization signal, and when there are bits which are not completely output to the data terminal within the second time period, the non-output data output data is output in a fourth period after the third time period. Therefore, a semiconductor memory device with faster operation and improved ease of use is obtained.

(3) A timing convention period having a unit time period specified by the synchronization signal is set between the output end timing of the last read data in the second time period and the input timing of write data in the third time period. Therefore, data input and output can be definitively changed over with optimum timing in accordance with the bus construction connected thereto or the control on the host side.

(4) A timing specification period having a unit time period specified by the synchronization signal is set between the input timing of the last write data in the third time period and the output timing of the first read data in the fourth time period. Therefore, data input and output can be reliably changed over with optimum timing in accordance with the bus construction connected thereto or the control on the host side.

(5) The second time period has a time length set by the period of the synchronization signal. Therefore, internal operations can be realized or data input and output can be reliably changed over with optimum timing in accordance with the bus construction connected thereto or the control on the host side.

(6) The time length of the second time period is set by plural periods of the synchronization signal. Therefore, internal operations can be realized or data input and output can be reliably changed over with optimum timing in accordance with the bus construction connected thereto or the control on the host side.

(7) By using the synchronization signal and a clock signal, the construction is simple and a reliable time setting can be performed.

(8) The second time period is set by control data which specifies the number of unit time periods corresponding to the clock signal, and is set as an integral multiple of the unit time periods. Therefore, internal operations can be realized or data input and output can be reliably changed over with optimum timing in accordance with the bus construction connected thereto or the control on the host side, simply and flexibly.

(9) The control data which specifies the number of clock signals is set by an internal register. Therefore, data input and output can be reliably changed over with optimum timing in accordance with the bus construction connected thereto or the control on the host side, flexibly in accordance with the system by means of software.

(10) The control data corresponds to a half-clock cycle unit of the clock signal. Therefore, this matches the DDR mode, and a more rational time setting can be performed.

(11) A semiconductor memory comprising a synchronized bi-directional interface which performs data transfer in a read operation and a write operation in synchronism with a clock signal is provided. Registration of a write operation is enabled within a clock signal time period when read data should be output via an interface in the read operation, and a function is provided wherein, when a write operation is specified within the clock signal time period when read data should be output, the output of data is temporarily suspended before starting the input of write data, write data is input, and the suspended output of read data is resumed after completing input of the write data. Therefore, a semiconductor memory device suitable for high speed operation and 3D imaging can be obtained.

(12) An internal register is provided having a value set according to a time delay value, and a timing from when the write operation is specified until the input of the write data via an interface is started, is controlled based on the value of the internal register. Therefore, data input and output can be definitively changed over with optimum timing in accordance with the memory circuit itself or bus construction connected thereto, or the control on the host side.

(13) The timing takes an arbitrary value which corresponds to a half-clock cycle unit. Therefore, this matches the DDR mode, and a more rational time setting can be performed.

(14) The read data is block unit data which should be output sequentially respectively in synchronism with plural timings specified by the clock signal, temporary suspension of the output of the read data can be performed at any desired timing after read of the block unit data is started until it ends, and resumption of the output of read data which was temporarily suspended by the input of write data, is applied to the remainder of the block unit data. Therefore, a semiconductor memory device suitable for high speed operation and 3D imaging which is easy to use, can be obtained.

(15) A bi-directional interface is provided via which read and write data transfer is performed in synchronism with a clock signal. A read/write mechanism is provided, wherein data having a long bit length which is an integral multiple of the unit bit length of the read data transferred by the bi-directional interface is read internally, the long bit length read data is sequentially output for each unit bit length via the bi-directional interface, data input of write data having a long bit length which is an integral multiple of the unit bit length is performed via the bi-directional interface by one write command, and write data having the long bit length is written internally. A function is further provided such that read data of the unit bit length is assigned a first address, and read data is serially output in unit bit lengths by one read command from a desired first address to a desired range having a value updated by a predetermined address updating unit which respectively gives discrete address values. Therefore, a semiconductor memory device suitable for high speed operation and 3D imaging which is easy to use, can be obtained.

(16) The address update value is 2. Therefore, a semiconductor memory device suitable for the DDR mode and 3D graphics imaging by the Z buffer method, can be obtained.

(17) An internal register is provided in which data specifying the address update value is set, and the address update value is controlled based on the data in the internal register. Therefore, various data output operations can be realized by means of software.

(18) Read and write to continuous addresses, and read and write to addresses having arbitrary address shift values, are respectively specified by commands. Therefore, a semiconductor memory device suitable for 3D graphics data processing by the Z buffer method, can be obtained.

(19) The command which specifies read and write to the continuous addresses, and the command which specifies read and write to the addresses shifted by said arbitrary address update value, separately comprise individual commands. Therefore, a semiconductor memory device suitable for 3D graphics data processing by the Z buffer method, and which is easy to use, can be obtained.

(20) A mode register is further provided wherein data is set which specifies address update values to the mode register, and address read and write updates to continuous addresses, and address read and write updates to addresses having address values shifted by the arbitrary address update values, are controlled by data which specifies the address updating values. Therefore, a semiconductor memory device suitable for 3D graphics data processing by the Z buffer method, and which is easy to use, can be obtained.

(21) A bi-directional interface is provided which performs read and write data transfer in synchronism with a clock signal, together with plural memory mats respectively forming a bank and which can operate independently, a mechanism which, after performing operations according to a first read or write command, automatically performs a sequence of operations to lower a word line in a memory mat in which a read or write in the bank specified by the read or write command is executed and precharge a sense amplifier group, and a mechanism which, when a second read or write command is issued to the same bank immediately after the read or write command, extends the operation sequence which starts from the raising of the word line performed automatically to the termination of the second read or write command issued immediately afterwards. Therefore, a semiconductor memory device suitable for 3D graphics data processing by the Z buffer method, and which is easy to use, can be obtained.

(22) In a command control mechanism, when a second read command is issued to the same bank immediately after a first read command, the address relating to the mat specification/word line specification of the second command is ignored, and data having an address specified by the column address part of the second command from the sense amplifier group activated by the first read command is output, and when the second write command is issued to the same bank immediately after a first write command, the address relating to the mat specification/word line specification of the second command is ignored, and data input to the address specified by the column address part of the second command from the sense amplifier group activated by the first write command, can be written. Therefore, high speed operation in the same bank can be performed.

(23) A bi-directional interface is provided which can perform read and write data transfer in synchronism with a clock signal, together with plural memory blocks forming a bank which function independently, and a command circuit into which commands may be continuously input with a shorter period than the period of an internal read or write operation. A command control mechanism is provided which, when a second read command is input to the same bank immediately after the first read command, automatically outputs address data following the first read data regardless of the address of the second command, when a second write command is input to the same bank immediately after the first write command, extends an internal write operation until input of data for the second write command is complete, and can automatically write address data immediately following the first write command regardless of the address of the second command, and a mat mechanism is further provided which can read or write data having twice the bit width of an ordinary command in one operation to enable the aforesaid control. Therefore, a semiconductor memory device suitable for 3D graphics data processing by the Z buffer method, and which is easy to use, can be obtained.

(24) A synchronized bi-directional interface is provided in which read and write data transfer is performed in synchronism with a clock signal, together with plural memory blocks forming a bank which function independently, a mechanism which raises the address word line specified in a lower address part of the bank specified by the bank address part of the command, and reads the contents of plural memory cells on a corresponding sense amplifier group, a mechanism which writes part or all of the bits specified by the column address part of the command in the aforesaid sensor amplifier group from an internal data latch, and a mechanism which, after the read or write command is terminated, lowers the word line in the memory mat in which read or write in the bank specified by the read or write command is performed, and precharges the sense amplifier group, wherein data is set to the internal data latch, and when there is a first command which writes from the internal data latch to plural sense amplifier groups, and a second command which lowers the word line which is presently raised without precharging the sense amplifier and then raises the following word line, an ordinary operation is started wherein, when the second command does not continue immediately after the first or second command, the word line is lowered, and the sense amplifier is precharged. Therefore, a semiconductor memory device suitable for 3D graphics data processing by the Z buffer method, and which is easy to use, can be obtained.

(25) Data read operations and write operations are specified by commands, and respond to a first read command which performs data readout from a memory address according to address information, and a second read command which has a different command code from the first command and performs data readout from a memory address sequentially removed from the read start address. Therefore, a semiconductor memory device suitable for 3D graphics data processing by the Z buffer method, and which is easy to use, can be obtained.

(26) The first command is a command which performs readout of data from a memory block selection address, and the second command is a command which performs a burst read The operation which reads readout data from a memory address sequentially removed from the read start address in synchronism with a synchronization signal. Therefore, a semiconductor memory device suitable for 3D graphics data processing by the Z buffer method, and which is easy to use, can be obtained.

(27) The second read command sets the read start address according to address information of the column address of the memory block, and the sequentially removed memory address is formed according to the synchronization signal. Therefore, a semiconductor memory device suitable for high speed operation and 3D graphics data processing by the Z buffer method, and which is easy to use, can be obtained.

(28) The sequential address period according to the second command is 2. Therefore, a semiconductor memory device suitable for the DDR mode and suitable for 3D graphics data processing by the Z buffer method, and which is easy to use, can be obtained.

(29) Plural memory banks are provided, and a synchronized bi-directional interface is provided common to the plural memory banks which outputs read data and inputs write data in synchronism with a clock signal which permits read and write operation specifications according to a memory bank specification, wherein when one read operation is specified, read data is output from a timing at which the operation was specified, from a memory bank specified after a first time period which is an integral multiple of a unit time period set by the clock signal via the synchronized bi-directional interface has elapsed, when one write operation is specified, data written to a specified memory bank is acquired from a timing at which the operation was specified via the synchronized bi-directional interface after a second time period which is an integral multiple of a unit time period set by the clock signal has elapsed, these operations can respond to plural sequential read operation specifications or plural sequential write operation specifications at each unit time period set by the clock signal regardless of the first or second time period corresponding to the preceding operation specifications, and when a write operation is specified before the termination of the read operation, output of read data via the synchronized bi-directional interface is permitted until a second time period corresponding to this write operation specification, and write data is then acquired via the synchronized bi-directional interface after the second time period has elapsed. Therefore, a semiconductor memory device suitable for high speed operation and 3D graphics imaging, and which is easy to use, can be obtained.

(30) The plural memory banks are each formed from one memory block. Therefore, memory access control can be performed simply and reliably.

(31) When write data according to the write operation specification is acquired, and there is still some unread data corresponding to the preceding read operation specification which has not yet been output via the synchronized bi-directional interface, this unread readout data is output via the synchronized bi-directional interface after acquisition of the write data is terminated. Therefore, a semiconductor memory device suitable for high speed operation and 3D graphics imaging can be obtained.

(32) A timing specification period comprising a unit time period set by the above clock signal, is set between a read data output end timing immediately prior to the timing at which write data starts to be acquired via the synchronized bi-directional interface corresponding to the write operation specification and the write data acquisition start timing. Therefore, a reliable, desired operation can be performed so that output data and input data collide when the bi-directional bus is changed over.

(33) A timing specification period having a unit time period set by the above clock signal between the above write data acquisition end timing and the above unread read data output timing, is set. Therefore, a reliable, desired operation can be performed so that output data and input data collide when the bi-directional bus is changed over.

(34) When a read operation is specified after a write operation, and the read end timing of the unread read data via the synchronized bi-directional interface exceeds the timing specified by the first time period relative to a subsequent read operation specification, the read data relative to a subsequent read operation specification is output via the synchronized bi-directional interface not accompanied by the timing set period following the read end timing of the unread read data. Therefore, a semiconductor memory device which is easy to use, is obtained by outputting via the synchronized bi-directional interface.

(35) The internal operation is specified by an operating specification command from outside, and can respond to a first command having a first command code, which clears the contents of plural memory cells which form a memory block whereof the period is a first unit time period determined by the synchronization signal, and a second command having a different code from the first command code, which writes data from a data transfer region to an addressed memory cell in a memory block whereof the time period is a second unit time period determined by the synchronization signal. Therefore, a semiconductor memory device suitable for 3D graphics data processing by the Z buffer method, and which is easy to use, can be obtained.

(36) The second command performs the writing whereof the time period is the second unit time period on plural occasions while updating the address. Therefore, a semiconductor memory device suitable for 3D graphics data processing by the Z buffer method, and which is easy to use, for example for initialization, can be obtained.

(37) The data transfer region comprises plural unit data regions for which transfer unit data is set sequentially every second unit time period. Therefore, a semiconductor memory device suitable for 3D graphics data processing by the Z buffer method, and which is easy to use, for example for initialization of the display, can be obtained.

(38) The second command is plural transferred unit data complex transferred data from the plural unit data regions, and the complex transferred data is sequentially written to plural memory cells having mutually different addresses. Therefore, a semiconductor memory device suitable for 3D graphics data processing by the Z buffer method, and which is easy to use, for example for fast initialization, can be obtained.

(39) The addresses comprise a combination of a first address and second address, and the second command includes a first operation in which transfer data is simultaneously written to plural memory cells which are in the range of the first address and in plural second addresses in a unit time period having the second unit time period as period. Therefore, a semiconductor memory device suitable for 3D graphics data processing by the Z buffer method, and which is easy to use, for example for a fast clear operation, can be obtained.

(40) The second command repeats the operation of the unit time period while performing an operation which updates the first address every unit time period. Therefore, a semiconductor memory device suitable for 3D graphics data processing by the Z buffer method, and which is easy to use, for example for a fast clear operation, can be obtained.

(41) The first command is a command which performs the above operation of clearing the memory cells, and an equalization operation which, after the termination of this operation, forces the data line system composition of a memory block to an equalization potential level, and the second command is a command which performs the above write operation of writing data from the above data transfer region to the memory cells, and after terminating the above write operation, forces the data line system composition of a memory block to an equalization potential level. Therefore, a semiconductor memory device suitable for 3D graphics data processing by the Z buffer method, and which is easy to use, for example for a fast clear operation, can be obtained.

(42) The first command is a command which performs the above operation of clearing the memory cells and an equalization operation which, after the termination of this operation, forces the data line system composition of a memory block to an equalization potential level, and the second command is a command which performs the above write operation, repeats the updating of the first address and writing of data from the data transfer region to the memory cells, and after terminating the above write operation, forces the data line system composition of a memory block to an equalization potential level. Therefore, a semiconductor memory device suitable for 3D graphics data processing by the Z buffer method, and which is easy to use, for example for a fast clear operation, can be obtained.

(43) The first command or second command render said equalization operation invalid when a subsequent first command or second command is issued within the period of circuit operation due to said first command or second command. Therefore, a semiconductor memory device suitable for 3D graphics data processing by the Z buffer method, and which is easy to use, for example for a fast clear operation, can be obtained.

(44) Plural memory banks are provided which are respectively addressed by bank addresses, and the first command and second command perform operations on memory banks specified by the bank addresses. Therefore, a semiconductor memory device suitable for 3D graphics data processing by the Z buffer method, and which is easy to use, for example for a fast clear operation, can be obtained.

(45) The internal operation is controlled by plural commands, the plural commands being respectively specified by the bits of plural bits, and comprising a first sort of command and second sort of command, wherein the first sort of command is a command which specifies an internal operation function of a unit by itself, and the second sort of command specifies an internal operation function in combination with an additional command. Therefore, rational operation control corresponding to the internal operation can therefore be performed.

(46) The first sort of command is a command for controlling the main operations of the memory device comprising data write operation control and data read operation control, and the second sort of command is a command for controlling the auxiliary operations of the memory device comprising test operation control and reset operation control. Therefore, suitable operation control corresponding to the type of memory operation can be performed.

(47) A layer structure comprising a first operation control command and second operation control command specified by first plural bits, and a third operation control command which is made significant by the first operation control command, and is specified by second plural bits, is adopted. Therefore, suitable operation control corresponding to the memory operation can be performed.

(48) The first operation control command is an operation control command requiring external address information, and the second operation control command is an operation control command which does not require external memory address information. Therefore, the third operation control command is given plural roles, and various types of memory control can be performed with a small number of terminals.

(49) The second plural bits are bits in different bit positions from the first plural bits. Therefore, the second plural bits can be given plural roles following the first bits.

(50) The first to third operation control commands and the address information for the first operation control command comprise packets, the first plural bits for the first and second operation control commands are situated in a first region of the packet composition, and the address information for the first operation control command and second plural bits for the third operation control command are situated in a second region of the packet composition. Therefore, the control terminals may be used in time division, and various types of command input suited to the internal circuit operation are possible with a small number of terminals.

(51) A first decoder which performs decoding of the first plural bits, and a second decoder which, when the second operation control command is given, has effective operation due to the decoding result output from the first decoder and decodes the second plural bits, are provided. Therefore, various types of command input suited to the internal circuit operation are possible.

(52) The semiconductor memory device is a synchronous semiconductor memory device which operates in synchronism with a synchronization signal, the second operation control command is determined in a first time period specified by the synchronization signal, and the third operation control command is specified by the synchronization signal and determined in a second time period which is a time period after the first time period. Therefore, various types of command input suited to the internal circuit operation are possible with a small number of terminals.

The invention according to the Inventor has been described in detail based on the embodiments, but the invention is not limited to these embodiments, various modifications being possible within the scope and spirit of the appended claims. For example, when a data write is specified during data read, instead of terminating the data output operation and using the aforesaid clock for the time until data input starts, the signal which puts the output buffer into an output high impedance state maybe delayed using a delay circuit or the like, and data input permitted by this signal. Also the timing when the output buffer is reactivated after data input is terminated and unread data is output can also be generated by a signal obtained by delaying the data write termination signal by a delay circuit.

The composition of the package, pin layout, number of banks and storage capacity may take various forms. Likewise, various forms are possible for the internal construction of the memory circuit in addition to the embodiment of FIG. 3, FIG. 4. Regarding the composition of the memory mat, in addition to the return bit line or two intersection point bit line as in the embodiment of FIG. 5, an open bit line or a one intersection point bit line may be used wherein the bit line is extended on both sides centered on the sense amplifier.

The semiconductor memory device, in addition to being suitable for 3D graphics data processing by the Z buffer method, may be widely used as a device which can efficiently perform data input/output in byte units at high speed. The semiconductor memory device according to this invention may be used not only as one integrated circuit device, but also as an internal memory mounted in a system LSI.

Some typical advantages of this invention disclosed in the present application may be simply described as follows. Read data is output to a data terminal in a data read operation in synchronism with a synchronization signal and write data is input in a data write operation via the data terminal in synchronism with a synchronization signal, in a first time period when the output of read data to the data terminal should be performed, the input of write data via the data terminal is permitted, a second time period after a write operation until the input of a write data is started, and a third time period when the input of write data is performed are provided, and output of the read data to the data terminal is permitted within the second time period. Therefore, a semiconductor memory device suitable for high speed operation and 3D imaging can be obtained.

A bi-directional interface is provided which performs read and write data transfer in synchronism with a clock signal, together with plural memory mats respectively forming a bank which can operate independently, and a mechanism which, after performing operations according to a first read or write command, automatically performs a sequence of operations to lower a word line in a memory mat in which a read or write in the bank specified by the read or write command is executed and precharge a sense amplifier group, and when a second read or write command is issued to the same bank immediately after the read or write command, the operation sequence which starts from the raising of the word line performed automatically to the termination of the second read or write command issued immediately afterwards, is extended. Therefore, a semiconductor memory device suitable for 3D graphics data processing by the Z buffer method, and which is easy to use in a fast clear operation or the like, can be obtained.

A synchronized bi-directional interface is provided in which read and write data transfer is performed in synchronism with a clock signal, together with plural memory blocks forming a bank which function independently, a mechanism which raises the address word line specified in a lower address part of the bank specified by the bank address part of the command and reads the contents of plural memory cells on a corresponding sense amplifier group, a mechanism which writes part or all of the bits specified by the column address part of the command in the sensor amplifier group from an internal data latch, and a mechanism which, after the read or write command is terminated, lowers the word line in the memory mat in which read or write in the bank specified by the read or write command is performed, and precharges the sense amplifier group, wherein data is set to the internal data latch, and when there is a first command which writes from the internal data latch to plural sense amplifier groups, and a second command which lowers the word line which is presently raised without precharging the sense amplifier and then raises the following word line, an ordinary operation is started wherein, when the second command does not continue immediately after the first or second command, the word line is lowered, and the sense amplifier is precharged. Therefore, a semiconductor memory device suitable for 3D graphics data processing by the Z buffer method, and which is easy to use in a fast clear operation or the like, can be obtained.

In a semiconductor memory device, data read operations and write operations are specified by commands, and respond to a first read command which performs data readout from a memory address according to address information, and a second read command which has a different command code from the first command and performs data readout from a memory address sequentially removed from the read start address. Therefore, a semiconductor memory device suitable for 3D graphics data processing by the Z buffer method, and which is easy to use in a fast clear operation or the like, can be obtained.

Plural memory banks are provided, and a synchronized bi-directional interface is provided common to the plural memory banks which outputs read data and inputs write data in synchronism with a clock signal which permits read and write operation specifications according to a memory bank specification, and wherein when one read operation is specified, read data is output from a timing at which the operation was specified from a memory bank specified after a first time period, which is an integral multiple of a unit time period set by the clock signal via the synchronized bi-directional interface, has elapsed, when one write operation is specified, data written to a specified memory bank is acquired from a timing at which the operation was specified via the synchronized bi-directional interface after a second time period, which is an integral multiple of a unit time period set by the clock signal, has elapsed, these operations can respond to plural sequential read operation specifications or plural sequential write operation specifications at each unit time period set by the clock signal regardless of the first or second time period corresponding to the preceding operation specifications, when a write operation is specified before the termination of the read operation, output of read data via the synchronized bi-directional interface is permitted until a second time period corresponding to this write operation specification, and write data is then acquired via the synchronized bi-directional interface after the second time period has elapsed. Therefore, a semiconductor memory device suitable for high speed operation and 3D graphics imaging, can be obtained.

In a semiconductor memory device, the internal operation is specified by an operating specification command from outside, and can respond to a first command having a first command code, which clears the contents of plural memory cells which form a memory block whereof the time period is a first unit time period determined by the synchronization signal, and a second command having a different code from the first command code, which writes data from a data transfer region to an addressed memory cell in a memory block whereof the time period is a second unit time period determined by the synchronization signal. Therefore, various types of command input which match the internal circuit operation are possible with a small number of terminals.

What is claimed is:

1. A semiconductor memory device which outputs read data to a data terminal in a data read operation in synchronism with a synchronization signal and inputs write data in a data write operation via said data terminal in synchronism with a synchronization signal, wherein:

in a first time period when the output of read data to the data terminal should be performed, the input/output operation which permits input of write data via the data terminal is permitted; and a second time period after a write operation until the input of a write data is started, and a third time period when the input of write data is performed are provided, and output of said read data to the data terminal is permitted within the second time period.

2. The semiconductor memory device according to claim 1, wherein said read data comprises plural bits which should be output sequentially according to a timing determined by the synchronization signal, and when there are bits which are not completely output to the data terminal within the second time period, said non-output data output data is output in a fourth period after the third time period.

3. The semiconductor memory device according to claim 1 or 2, wherein a timing convention period having a unit time period specified by the synchronization signal is set between the output end timing of the last read data in the second time period and the input timing of write data in the third time period.

4. The semiconductor memory device according to claim 2, wherein a timing specification period having a unit time period specified by the synchronization signal is set between the input timing of the last write data in the third time period and the output timing of the first read data in the fourth time period.

5. The semiconductor memory device according to claim 1 or 2, wherein the second time period has a time length set by the period of the synchronization signal.

6. The semiconductor memory device according to claim 5, wherein the time length of the second time period is set by plural periods of the synchronization signal.

7. The semiconductor memory device according to claim 1 or 2, wherein said synchronization signal is a clock signal.

8. The semiconductor memory device according to claim 7, wherein the second time period is set by control data which specifies the number of unit time periods corresponding to the clock signal, and is set as an integral multiple of said unit time periods.

9. The semiconductor memory device according to claim 8, wherein the control data which specifies the number of clock signals is set by an internal register.

10. The semiconductor memory device according to claim 9, wherein said control data corresponds to a half-clock cycle unit of said clock signal.

11. A semiconductor memory comprising a synchronized bi-directional interface which performs data transmission in a read operation and a write operation in synchronism with a clock signal, and having a function wherein:

registration of a write operation is enabled within a clock signal time period when read data should be output via the interface in said read operation; and when a write operation is specified within the clock signal time period when read data should be output, the output of data is temporarily suspended before starting the input of write data, write data is input, and the suspended output of read data is resumed after completing input of the write data.

12. The semiconductor memory device according to claim 11, further comprising an internal register having a value set according to a time delay value, wherein:

a timing from when the write operation is specified until the input of the write data via an interface is started, is controlled based on the value of the internal register.

13. The semiconductor memory device according to claim 12, wherein the timing takes an arbitrary value which corresponds to a half-clock cycle unit.

14. The semiconductor memory device according to claim 11 or 12, wherein:

the read data is block unit data which should be output sequentially respectively in synchronism with plural timings specified by the clock signal;

temporary suspension of the output of the read data can be performed at any desired timing after read of the bloc unit data is started until it ends; and resumption of the output of read data which was temporarily suspended by the input of write data, is applied to the remainder of said block unit data.

15. A semiconductor memory device, comprising a plurality of memory banks, and a synchronized bi-directional interface common to the plurality of memory banks which outputs read data and inputs write data in synchronism with a clock signal, which permits read and write operation specifications according to a memory bank specification, and wherein, when one read operation is specified, read data is output from a timing at which the operation was specified, from a memory bank specified after a first period which is an integral multiple of a unit period set by the clock signal via the synchronized bi-directional interface has elapsed, and when one write operation is specified, data written to a specified memory bank is acquired from a timing at which the operation was specified via the synchronized bi-directional interface after a second period which is an integral multiple of a unit period set by the clock signal has elapsed, wherein said device can respond to a plurality of sequential read operation specifications or a plurality of sequential write operation specifications at each unit period set by the clock signal regardless of the first or second period corresponding to the preceding operation specifications, and when a write operation is specified before the termination of the read operation, output of read data via the synchronized bi-directional interface is permitted until a second period corresponding to this write operation specification, and write data is then acquired via the synchronized bi-directional interface after the second period has elapsed.

16. The semiconductor memory device according to claim 15, wherein:

the plurality of memory banks are each formed from one memory block.

17. The semiconductor memory device according to claim 15 or claim 16, wherein:

when write data according to said write operation specification is acquired, and there is still some unread data corresponding to the preceding read operation specification which has not yet been output via the synchronized bi-directional interface, this unread readout data is output via the synchronized bi-directional interface after acquisition of the write data is terminated.

18. The semiconductor memory device according to claim 15 or 16, wherein:

a timing specification period comprising a unit period set by the above clock signal, is set between a read data output end timing immediately prior to the timing at which write data starts to be acquired via the synchronized bi-directional interface corresponding to said write operation specification and the write data acquisition start timing.

19. The semiconductor memory device according to claim 17, wherein:

a timing specification period having a unit period set by the above clock signal between the above write data acquisition end timing and the above unread readout data output timing, is set.

20. The semiconductor device according to claim 19, wherein, when a read operation is specified after a write operation, and the read end timing of the unread readout data via the synchronized bi-directional interface exceeds the timing specified by the first time period relative to a subsequent read operation specification, the read data relative to a subsequent read operation specification is output via the synchronized bi-directional interface not accompanied by the timing set period following the read end timing of the unread readout data.

* * * * *